US012004404B2

(12) United States Patent
Park et al.

(10) Patent No.: US 12,004,404 B2
(45) Date of Patent: Jun. 4, 2024

(54) ELECTRONIC APPARATUS

(71) Applicant: Samsung Display Co., Ltd., Yongin-Si (KR)

(72) Inventors: Jongseon Park, Hwaseong-si (KR); Hwan-Hee Jeong, Cheonan-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/886,723

(22) Filed: Aug. 12, 2022

(65) Prior Publication Data

US 2023/0320165 A1    Oct. 5, 2023

(30) Foreign Application Priority Data

Mar. 15, 2022 (KR) ........................ 10-2022-0032085

(51) Int. Cl.
*G06F 3/044* (2006.01)
*H01L 27/32* (2006.01)
*H10K 59/35* (2023.01)
*H10K 59/40* (2023.01)

(52) U.S. Cl.
CPC ........... *H10K 59/40* (2023.02); *G06F 3/0446* (2019.05); *H10K 59/353* (2023.02); *G06F 2203/04112* (2013.01)

(58) Field of Classification Search
CPC . H01L 27/323; H01L 27/3218; G06F 3/0446; G06F 2203/04112
See application file for complete search history.

(56) References Cited

U.S. PATENT DOCUMENTS 10,418,424 B2    9/2019   Oh et al.
10,685,626 B2    6/2020   Kim et al.
10,761,665 B2    9/2020   Park
(Continued)

FOREIGN PATENT DOCUMENTS

KR    10-2017-0119794 A    10/2017
KR    10-2019-0101517 A     9/2019
(Continued)

OTHER PUBLICATIONS https://www.ajunews.com/view/20210812023705244.
https://bit.ly/3zkCu6m.

*Primary Examiner* — Md Saiful A Siddiqui
(74) *Attorney, Agent, or Firm* — Innovation Counsel LLP

(57) ABSTRACT

Provided is an electronic apparatus including a display panel configured to provide an active region including a plurality of light-emitting regions, a first electrode including a plurality of first sensor patterns disposed in the active region and a plurality of first connection patterns respectively connected to the first sensor patterns, and a second electrode including a plurality of second sensor patterns insulated from the first electrode and disposed in the active region and a plurality of second connection patterns respectively connected to the second sensor patterns, wherein each of the first connection patterns includes a first pattern and a second pattern separated from each other in a first direction and respectively having a bar shape extending along a second direction crossing the first direction, and the light-emitting regions include at least one light-emitting pixel spaced apart from and disposed between the first pattern and the second pattern.

20 Claims, 25 Drawing Sheets

(56) References Cited

U.S. PATENT DOCUMENTS

| | | |
|---|---|---|
| 11,079,885 B2 | 8/2021 | Jo et al. |
| 11,086,439 B2 | 8/2021 | Ding et al. |
| 2014/0313431 A1* | 10/2014 | Chang .................. G06F 3/0412 349/12 |
| 2015/0346866 A1* | 12/2015 | Kusunoki ............. G06F 3/0445 345/174 |
| 2016/0328071 A1* | 11/2016 | Yan ....................... G06F 3/0445 |
| 2016/0378224 A1* | 12/2016 | Kwon ................... G06F 3/0445 345/174 |
| 2018/0039360 A1* | 2/2018 | Akimoto ................ H10K 50/86 |
| 2020/0363905 A1* | 11/2020 | Jo .......................... G06F 3/0443 |
| 2021/0004094 A1* | 1/2021 | Jeong ................... G06F 3/0446 |
| 2021/0004123 A1* | 1/2021 | Tan ..................... H01L 27/1222 |
| 2021/0191556 A1* | 6/2021 | Lee ..................... H10K 59/352 |

FOREIGN PATENT DOCUMENTS

| | | |
|---|---|---|
| KR | 10-2089340 B1 | 3/2020 |
| KR | 10-2020-0131691 A | 11/2020 |

\* cited by examiner

ELECTRONIC APPARATUS

CROSS-REFERENCE TO RELATED APPLICATIONS

This U.S. non-provisional patent application claims priority under 35 U.S.C. § 119 to Korean Patent Application No. 10-2022-0032085, filed on Mar. 15, 2022, the entire contents of which are hereby incorporated by reference.

BACKGROUND

The present disclosure herein relates to an electronic apparatus, and more particularly, to an electronic apparatus including a touch sensor.

Multimedia electronic devices such as televisions, mobile phones, tablet computers, navigation systems, and game machines are equipped with an electronic apparatus for displaying images. The electronic apparatus may include an input sensor capable of providing a touch-based input that enables a user to input information or a command easily, intuitively, and conveniently in addition to a usual input method such as a button, a keyboard, and a mouse.

SUMMARY

The present disclosure provides an electronic apparatus having improved touch sensitivity and visibility.

An embodiment of the inventive concept provides an electronic apparatus including: a display panel including an active region which includes a plurality of light-emitting regions; a first electrode including a plurality of first sensor patterns disposed in the active region and a plurality of first connection patterns respectively connected to the plurality of first sensor patterns; and a second electrode including a plurality of second sensor patterns insulated from the first electrode and disposed in the active region and a plurality of second connection patterns respectively connected to the plurality of second sensor patterns, wherein: each of the first connection patterns includes a first pattern and a second pattern spaced apart from each other in a first direction and respectively having a bar shape extending along a second direction crossing the first direction; and the plurality of light-emitting regions include at least one light-emitting pixel spaced apart from and disposed between the first pattern and the second pattern.

In an embodiment, the light-emitting pixel may include a plurality of sub-pixels, and the sub-pixels may be spaced apart from each other in the first direction or in the second direction.

In an embodiment, the light-emitting pixel may be provided in plural between the first pattern and the second pattern, and the plurality of light-emitting pixels may be arranged along the second direction.

In an embodiment, the plurality of first sensor patterns, the plurality of second sensor patterns, and the plurality of second connection patterns may be disposed on a layer different from a layer on which the plurality of first connection patterns are disposed.

In an embodiment, the electronic apparatus may further include a floating pattern insulated from the first electrode and the second electrode, and disposed between the first pattern and the second pattern, wherein the floating pattern may be disposed on a layer different from the layer on which the plurality of first connection patterns.

In an embodiment, each of the first connection patterns may further include: a third pattern extending along the second direction and connected to each of the plurality of first pattern and the second pattern; and a fourth pattern extending along the second direction, spaced apart from the third pattern in the first direction, and connected to each of the first pattern and the second pattern, wherein contact holes connecting the plurality of first connection patterns and the plurality first sensor patterns through the contact holes may be respectively formed to overlap the third pattern and the fourth pattern in a plan view.

In an embodiment, the contact holes overlapping the third pattern may be arranged in a line along the second direction.

In an embodiment, an edge of the active region may include at least one curved portion.

In an embodiment, the electronic apparatus may further include a plurality of signal lines connected to the plurality of first sensor patterns, respectively, wherein the signal lines may have a curved portion.

In an embodiment, each of the plurality of first sensor patterns may include first mesh lines extending along the first direction and second mesh lines extending along the second direction.

In an embodiment, each of the first pattern and the second pattern may be any one of the second mesh lines.

In an embodiment of the inventive concept, an electronic apparatus includes: a display panel including an active region which includes a plurality of light-emitting regions; a first electrode including a plurality of first sensor patterns disposed in the active region and a plurality of first connection patterns respectively connected to the plurality of first sensor patterns; a second electrode including a plurality of second sensor patterns insulated from the first electrode and disposed in the active region and a plurality of second connection patterns respectively connected to the plurality of second sensor patterns; and a floating pattern insulated from each of the first electrode and the second electrode, wherein: an edge of the active region may include at least one curved portion; each of the plurality of first connection patterns may include a first pattern and a second pattern spaced apart from each other in the first direction; and the floating pattern may be disposed between the first pattern and the second pattern on a layer different from a layer on which the plurality of first connection patterns are disposed.

In an embodiment, each of the first pattern and the second pattern may have a bar shape extending along the second direction.

In an embodiment, each of the plurality of first connection patterns may further include a third pattern and a fourth pattern spaced apart from each other in the second direction with the first pattern and the second pattern interposed therebetween and connected to the first pattern and the second pattern and contact holes connecting the plurality of first connection patterns and the plurality of first sensor patterns through the contact holes may be formed to overlap the third pattern and the fourth pattern in a plan view.

In an embodiment, the arrangement direction of the contact holes may be a direction crossing the second direction.

In an embodiment, at least three sub-pixels may be disposed between the first pattern and the second pattern, and each of the plurality of light-emitting regions may be a region in which each of the at least three sub-pixels emits light.

In an embodiment, the sub-pixels may be spaced apart from each other in the first direction or in the second direction.

In an embodiment, each of the plurality of first connection patterns may include first mesh lines extending along the first direction and second mesh lines extending along the second direction, and each of the first pattern and the second pattern may be any one of the second mesh lines.

In an embodiment, the floating pattern may be disposed in the same layer as the plurality of first sensor patterns.

In an embodiment, the first pattern and the second pattern may be disposed between the plurality of light-emitting regions.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain the principles of the inventive concept. In the drawings.

DETAILED DESCRIPTION

Figure 1:
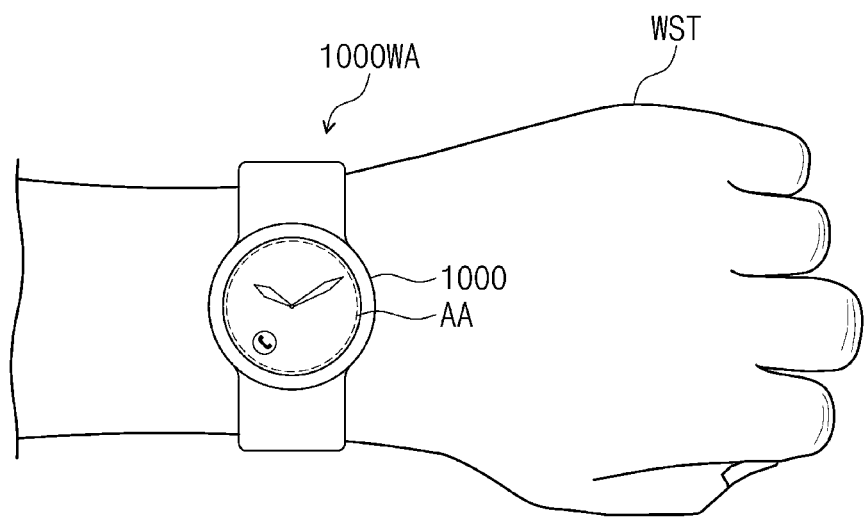
FIG. 1 is an application example of an electronic apparatus according to an embodiment of the inventive concept.

In this specification, it will be understood that when an element (or region, layer, portion, etc.) is referred to as being "on", "connected to" or "coupled to" another element, it can be directly on, connected or coupled to the other element, or intervening elements may be present.

Like reference numerals refer to like elements throughout. In addition, in the drawings, the thicknesses, ratios, and dimensions of elements are exaggerated for effective description of the technical contents.

As used herein, the term "and/or" includes any and all combinations that the associated configurations can define.

It will be understood that, although the terms first, second, etc. may be used herein to describe various elements, these elements should not be limited by these terms. These terms are only used to distinguish one element from another element. For example, a first element could be termed a second element without departing from the scope of the present invention. Similarly, the second element may also be referred to as the first element. The terms of a singular form include plural forms unless otherwise specified.

In addition, terms, such as "under", "lower", "above", "upper" and the like, are used herein for ease of description to describe one element's relation to another element(s) as illustrated in the figures. The above terms are relative concepts and are described based on the directions indicated in the drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that the terms "include" and/or "have", when used in this specification, specify the presence of stated features, integers, steps, operations, elements, components and/or combinations thereof, but do not preclude the presence or addition of one or more other features, integers, steps, operations, elements, components, and/or combinations thereof.

Hereinafter, embodiments of the inventive concept will be described with reference to the accompanying drawings.

FIG. 1 is an application example of an electronic apparatus according to an embodiment of the inventive concept.

Referring to FIG. 1, the electronic apparatus 1000 may be applied to a wearable device 1000WA. FIG. 1 illustrates an embodiment of a smart watch worn on a user's wrist. The electronic apparatus 1000 may display time information, weather information, or icons for performing various applications or operations. A user may operate the electronic apparatus 1000 through a touch operation. The electronic apparatus 1000 may have a circular active region AA.

The electronic apparatus 1000 may sense an external input applied to the active region AA. The external input which is applied from the outside may be provided in various forms. For example, the input may have various forms such as force, pressure, or light, as well as a touch or an adjacent touch by a part of a body such as a user's hand, and the inventive concept is not limited to any one embodiment.

FIGS. 2A to 2F are cross-sectional views of an electronic apparatus according to an embodiment of the inventive concept. FIGS. 2A to 2F illustrate cross-sections defined by the second direction DR2 and the third direction DR3. FIGS. 2A to 2F are simply illustrated to explain the stacking relationship of functional panels and/or functional units constituting the electronic apparatus 1000.

The electronic apparatus 1000 according to an embodiment of the inventive concept may include a display panel, an input sensor, an anti-reflection film, and a window. At least some elements among the display panel, the input sensor, the anti-reflective film, and the window may be formed by a continuous process, or at least some elements may be coupled to each other by an adhesive layer. FIGS. 2A to 2F exemplarily illustrate a pressure sensitive adhesive film PSA as one of the embodiments of the adhesive layer. The adhesive layer described hereinafter may include an ordinary adhesive or glue, and the embodiment of the inventive concept is not particularly limited thereto. In an embodiment of the inventive concept, an anti-reflective film and an optical control film may be replaced with other elements or omitted.

In FIGS. 2A to 2F, among the input sensor, the anti-reflective film, the optical control film, and the window, a corresponding element formed through a continuous process together with another element is expressed as a "layer". Among the input sensor, the anti-reflective film, the optical control film, and the window, an element combined with another element by an adhesive layer is expressed as a "panel". The panel includes a base layer, such as a synthetic resin film, a composite material film, or a glass substrate, which is configured to provide a base surface, but the base layer may be omitted in a "layer". In other words, the layers are directly disposed on a base surface provided by another unit.

Depending on the presence or absence of a base layer, the input sensor, the anti-reflective film, and the window may be referred to as an input sensing panel 200, an anti-reflective panel RPP, and a window panel WP, or as an input sensing layer 200, an anti-reflective layer RPL, and a window layer WL.

Figure 2A:
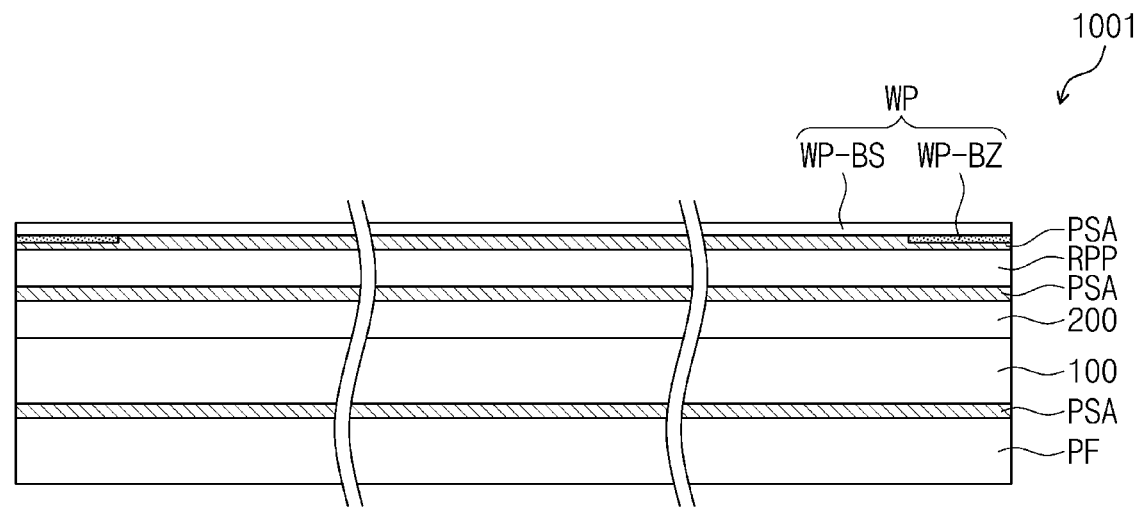
FIGS. 2A, 2B, 2C, 2D, 2E and 2F are cross-sectional views of an electronic apparatus according to an embodiment of the inventive concept.
Figure 2A:
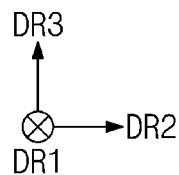

As illustrated in FIG. 2A, an electronic apparatus 1001 may include a display panel 100, an input sensing layer 200, an anti-reflective panel RPP, a window panel WP, and a protective panel PF. The display panel 100 corresponds to display layer. The input sensing layer 200 is directly disposed on the display panel 100. In this specification, the expression "Component. B1 is directly disposed on component A1" means that no adhesive layer is disposed between the component A1 and the component B L After the component. A1 has been formed, the component. B1 is directly formed on the component. A1 through a continuous process.

A pressure-sensitive adhesive film PSA is disposed between the input sensing layer 200 and the anti-reflective panel RPP, between the anti-reflective panel RPP and the window panel WP, and between the display panel 100 and the protective panel PF, respectively.

The display panel 100 displays an image IM (refer to FIG. 1), and the input sensing layer 200 obtains the coordinate information of an external input. The protective panel PF supports the display panel 100 and protects the display panel 100 from external impact.

The protective panel PF may include a plastic film as a base layer. The protective panel PF may include a plastic film including any one selected from the group consisting of thermoplastic resins, for example, polyethylene terephthalate (PET), polyethylene (PE), polyvinyl chloride (PVC), polypropylene (PP), polystyrene (PS), polyacrylonitrile (PAN), styrene-acrylonitrile copolymer (SAN), acrylonitrile-butadiene-styrene (ABS), polymethyl methacrylate (PMMA), and combinations thereof. In particular, polyethylene terephthalate (PET) has excellent heat resistance, fatigue strength, and electrical properties and thus is less affected by temperature and humidity.

The material constituting the protective panel PF is not limited to plastic resins and may include an organic/inorganic composite material. The protective panel PF may include a porous organic layer and an inorganic material that fills the pores of the organic layer.

The display panel 100 according to an embodiment of the inventive concept may be a light-emitting display panel and is not particularly limited thereto. For example, the display panel 100 may be an organic light-emitting display panel or a quantum dot light-emitting display panel. The light-emitting layer of the organic light-emitting display panel may contain an organic light-emitting material. The light-emitting layer of the quantum dot light-emitting display panel may contain quantum dots, quantum rods, and the like. Hereinafter, the display panel 100 will be described as an organic light-emitting display panel.

The anti-reflective panel RPP reduces the reflectance of natural light (or sunlight) incident from above the window panel WP. The anti-reflective panel RPP according to an embodiment of the inventive concept may include a retarder and a polarizer. The retarder may be a film type or liquid crystal coating type and may include $\lambda/2$ retarder and/or a $\lambda/4$ retarder. The polarizer may also be a film type or a liquid crystal coating type. The film type may include a stretched synthetic resin film, and the liquid crystal coating type may contain liquid crystals arranged in a predetermined arrangement. The retarder and the polarizer may further include a protective film. The retarder and the polarizer themselves or their protective films may be defined as a base layer of the anti-reflective panel RPP.

The anti-reflective panel RPP according to an embodiment of the inventive concept may include color filters. The color filters have a predetermined arrangement. The arrangement of the color filters may be determined in consideration of the light-emitting colors of pixels included in the display panel 100. The anti-reflective panel RPP may further include a black matrix disposed adjacent to the color filters.

The window panel WP according to an embodiment of the inventive concept includes a base layer WP-BS and a light blocking pattern WP-BZ. The base layer WP-BS may include a glass substrate, a synthetic resin film, and/or the like. The base layer WP-BS is not limited to a single layer. The base layer WP-BS may include two or more films coupled to each other by an adhesive layer.

The light blocking pattern WP-BZ partially overlaps the base layer WP-BS. The light blocking pattern WP-BZ may be disposed on the rear surface of the base layer WP-BS to define a bezel region of the electronic apparatus 1000, that is, a peripheral region NAA (refer to FIG. 1).

The light blocking pattern WP-BZ may be a colored organic layer and be formed by a coating method. However, this has been described as an example, and the method of forming the light blocking pattern WP-BZ is not limited to any one embodiment. Meanwhile, although not illustrated separately, the window panel WP may further include a functional coating layer disposed on the front surface of the base layer WP-BS. The functional coating layer may include an anti-fingerprint layer, an anti-reflective layer, and a hard coating layer.

In FIGS. 2B to 2F, the window panel WP and the window layer WL are briefly illustrated without distinction of the base layer WP-BS and the light blocking pattern WP-BZ.

Figure 2B:
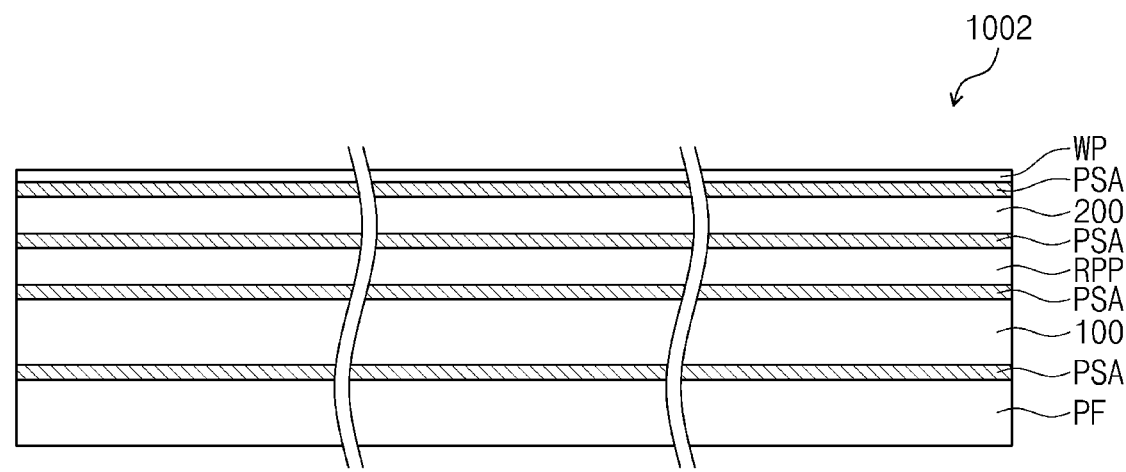
Figure 2B:
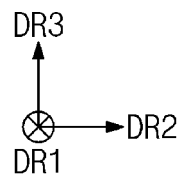
Figure 2C:
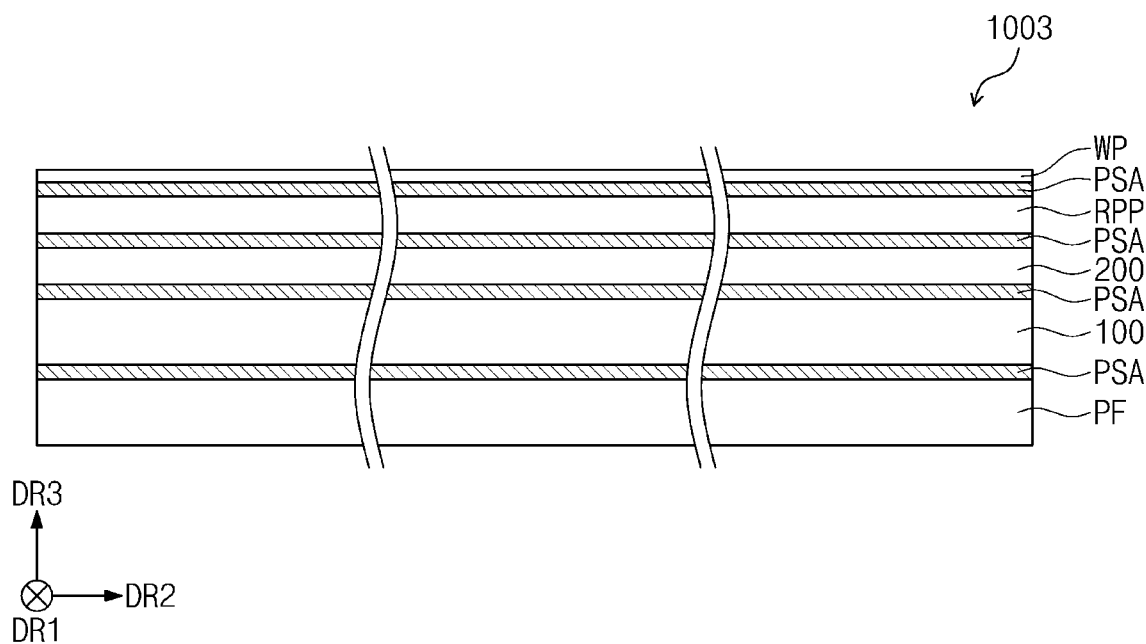

As illustrated in FIGS. 2B and 2C, electronic apparatuses 1002 and 1003 may include a protective panel PF, a display panel 100, an input sensing panel 200, an anti-reflective panel RPP, and a window panel WP. The stacking order of the input sensing panel 200 and the anti-reflective panel RPP may be changed.

Figure 2D:
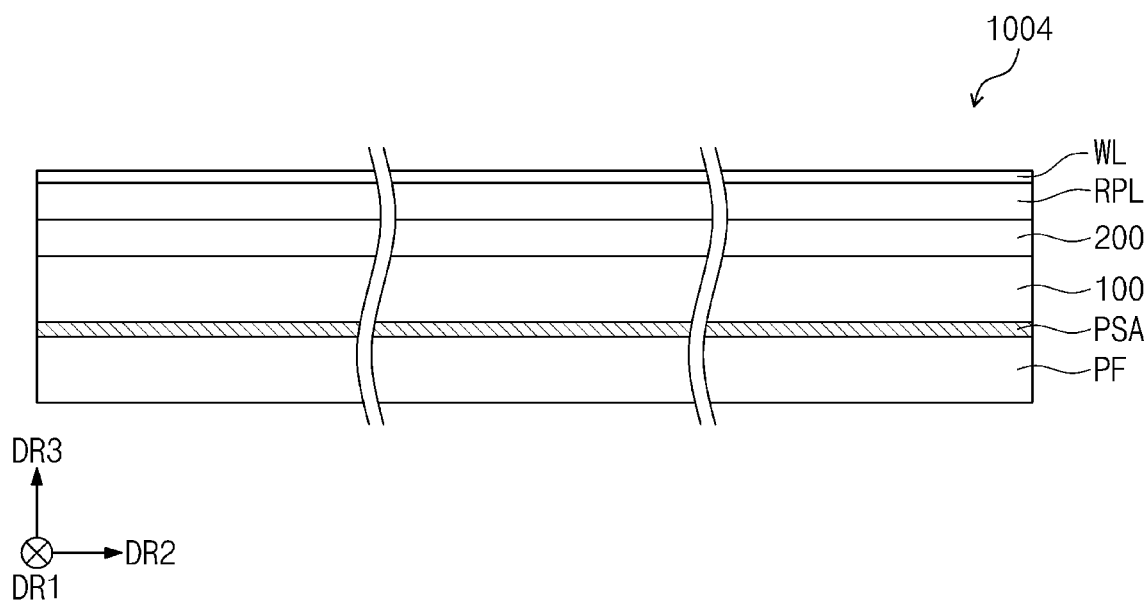

As illustrated in FIG. 2D, an electronic apparatus 1004 may include a protective panel PF, a display panel 100, an input sensing layer 200, an anti-reflective layer RPL, and a window layer WL. Adhesive layers may be omitted from the electronic apparatus 1004, and the input sensing layer 200, the anti-reflective layer RPL, and the window layer WL may be formed on the base surface provided by the display panel 100 through a continuous process. The stacking order of the input sensing layer 200 and the anti-reflective layer RPL may be changed.

In this case, the anti-reflective layer RPL may include a liquid crystal coating-type retarder and a liquid crystal coating-type polarizer. The retarder and the polarizer may include a discotic liquid crystal layer having a tilt angle in one direction.

Figure 2E:
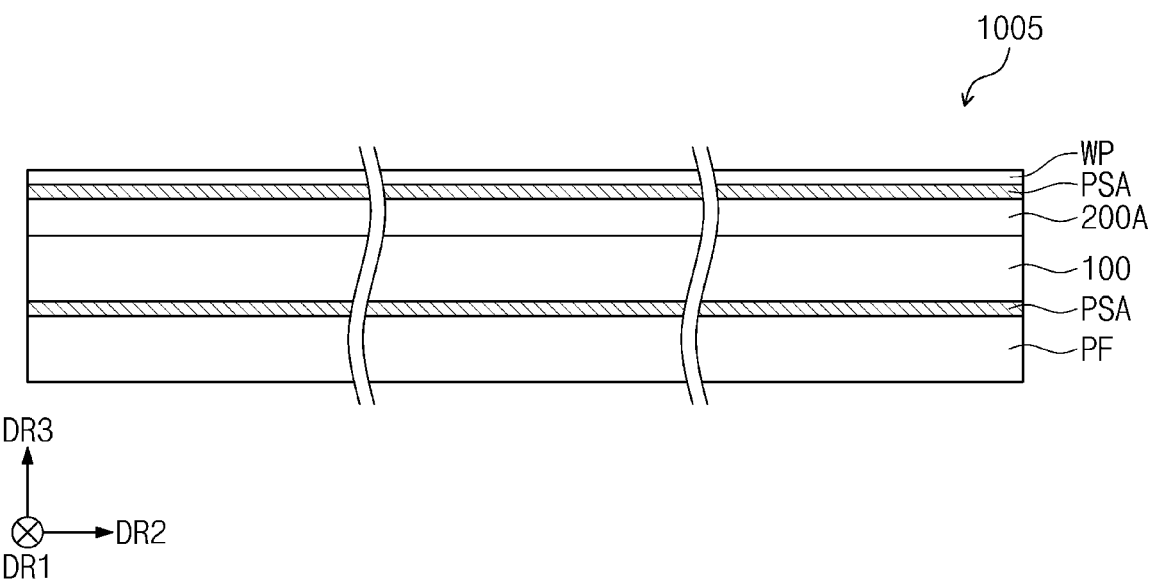
Figure 2F:
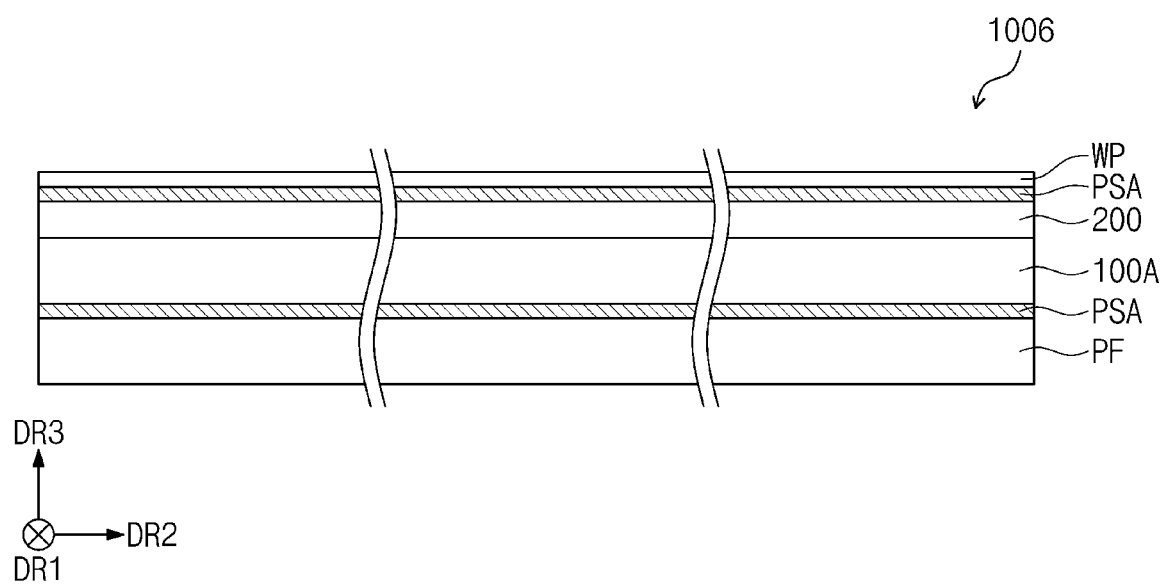

As illustrated in FIGS. 2E and 2F, electronic apparatuses 1005 and 1006 may not include a separate anti-reflective layer. Unlike the input sensing panel 200 or the input sensing layer 200 illustrated in FIGS. 2A to 2D, an input sensing layer 200A illustrated in FIG. 2E may further include a color filter having an anti-reflective function. Unlike the display panel 100 illustrated in FIGS. 2A to 2D, a display panel 100A illustrated in FIG. 2F may further include a color filter having an anti-reflective function.

Figure 3A:
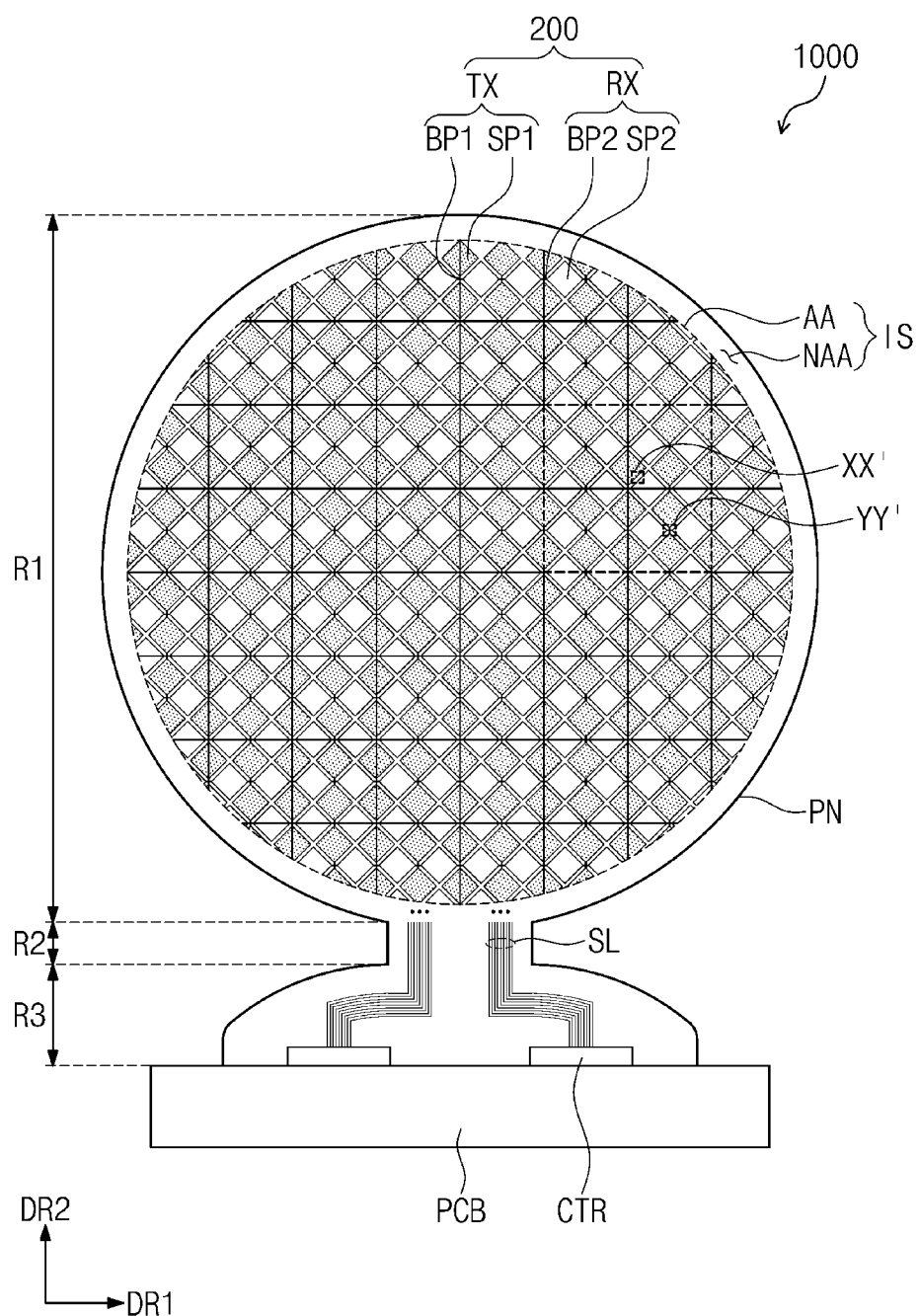
FIGS. 3A, 3B and 3C are plan views of an electronic apparatus according to an embodiment of the inventive concept.
Figure 3B:
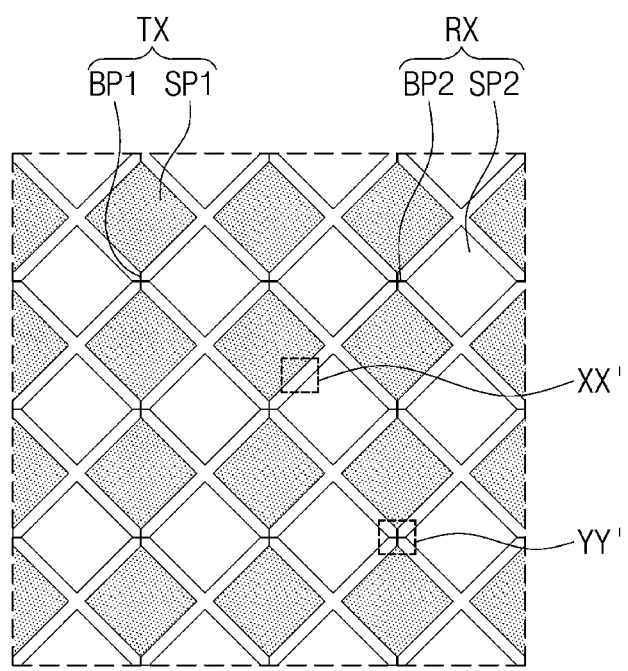
Figure 3C:
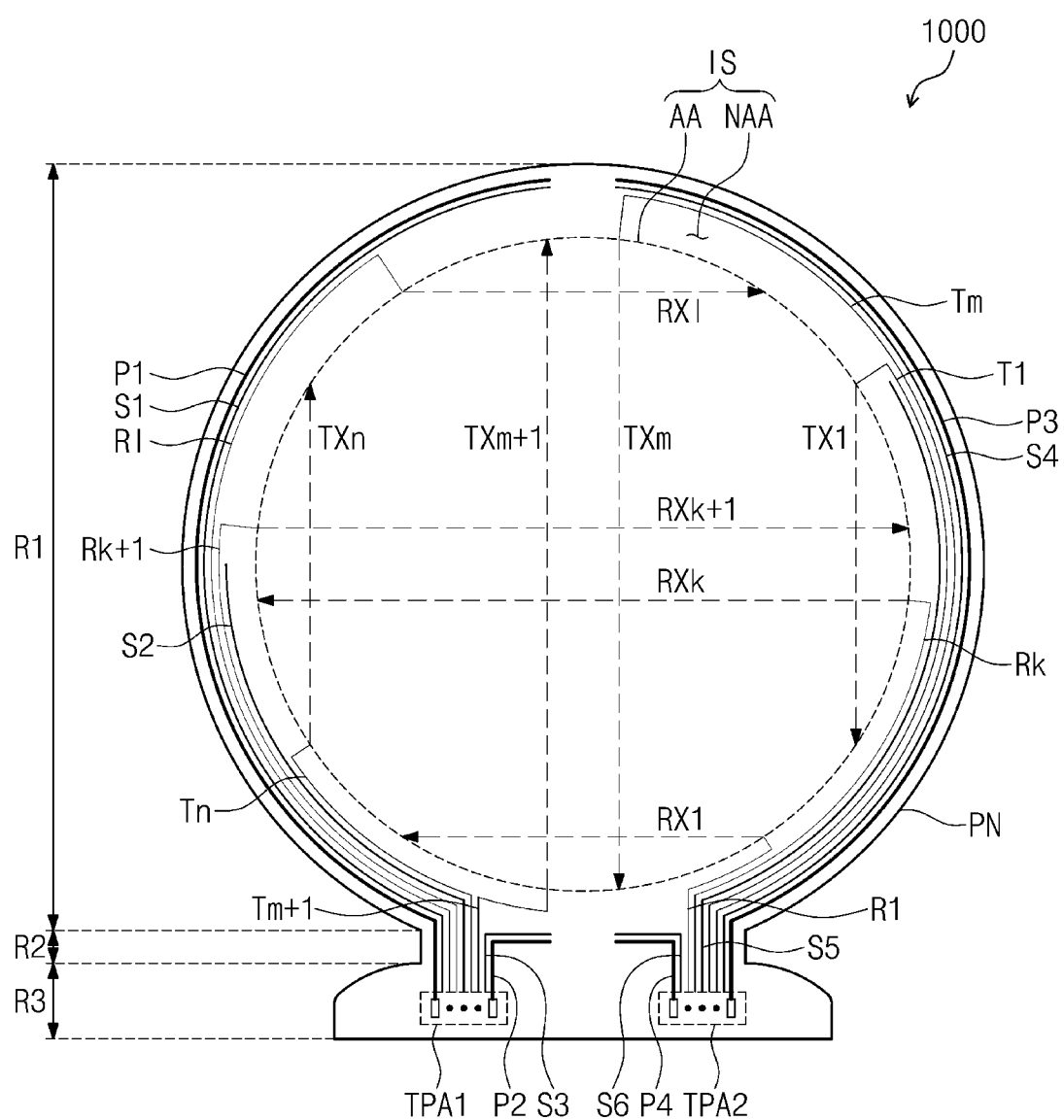

FIGS. 3A to 3C are plan views of an electronic apparatus according to an embodiment of the inventive concept. FIG. 3B is an enlarged view of a partial region of FIG. 3A. For ease of description, some elements are omitted in FIGS. 3A to 3C. The inventive concept will be described with reference to FIGS. 3A to 3C.

As illustrated in FIGS. 3A and 3B, the electronic apparatus 1000 may be provided in a form in which a panel that provides a circular active region AA on a front surface IS thereof and a circuit board PCB connected thereto are included. The panel may include a first portion R1, a second portion R2, and a third portion R3 sequentially arranged in the second direction DR2.

The first portion R1 includes the circular active region AA. The first portion R1 may be provided in a shape corresponding to a circular shape. However, this is illustrated as an example, and the first portion R1 may have various shapes such as an oval, a polygon, or an irregular shape, and the inventive concept is not limited to any one embodiment.

The second portion R2 is connected to the first portion R1. The second portion R2 may be spaced apart from the active region AA and include a peripheral region NAA. The width of the second portion R2 in the first direction DR1 may be smaller than the diameter of the first portion R1 and the maximum width of the third portion R3 in the first direction DR1. When the electronic apparatus 1000 is assembled, the second portion R2 may be bent with respect to a bending axis extending along the first direction DR1. According to the inventive concept, by making the second portion R2 have a smaller width than the first portion R1 or the third portion R3, a bending stress applied to the second portion R2 may be alleviated, thus improving the reliability of the panel.

The third portion R3 is connected to the second portion R2. The third portion R3 may be connected to the circuit board PCB. In this embodiment, a connector CTR for electrical connection with the circuit board PCB may be provided to the third portion R3. When the electronic apparatus 1000 is assembled, the third portion R3 may be moved to the rear surface of the first portion R1 to overlap the first portion R1 in a plan view. Accordingly, since the third portion R3 or the circuit board PCB may be accommodated to overlap the first portion R1, it is possible to provide the electronic apparatus 1000 having the same shape as the smart watch illustrated in FIG. 1 and the electronic apparatus 1000 having a narrow bezel as well.

FIGS. 3A and 3B schematically illustrate the elements of the input sensing layer 200. The input sensing layer 200 may include a plurality of sensor electrodes TX and RX and a plurality of signal lines SL. The sensor electrodes TX and RX are disposed in the active region AA to sense an external input.

The sensor electrodes TX and RX may include a plurality of first sensor electrodes TX arranged along the first direction DR1 and a plurality of second sensor electrodes RX arranged along the second direction DR2. The electronic apparatus 1000 may be driven in a mutual capacitance method in which the first sensor electrodes TX and the second sensor electrodes RX receive different electrical signals or in a self-capacitance method in which the first sensor electrodes TX and the second sensor electrodes RX receive a same electrical signal. Alternatively, the electronic apparatus 1000 may be driven in a resistance film method in which an external input is sensed through a change in resistance of each of the first sensor electrodes TX and the second sensor electrodes RX. The electronic apparatus 1000 according to an embodiment of the inventive concept may be driven in various methods as long as it can sense an external input through the first sensor electrodes TX and the second sensor electrodes RX, and the inventive concept is not limited to any one embodiment.

Each of the first sensor electrodes TX may include a plurality of first sensor patterns SP1 arranged along the second direction DR2 and a plurality of first connection patterns BP1 alternately arranged with the first sensor patterns SP1. Each of the first connection patterns BP1 electrically connects two first sensor patterns SP1 to each other which are adjacent to each other in the second direction DR2.

The second sensor electrodes RX are electrically insulated from the first sensor electrodes TX. Accordingly, the second sensor electrodes RX may be driven independently from the first sensor electrodes TX. Each of the second sensor electrodes RX may include a plurality of second sensor patterns SP2 arranged along the first direction DR1 and a plurality of second connection patterns BP2 alternately arranged with the second sensor patterns SP2. Each of the second connection patterns BP2 electrically connects two second sensor patterns SP2 to each other which are adjacent to each other in the first direction DR1.

The first connection patterns BP1 and the second connection patterns BP2 may be disposed on layers different from each other. The first connection patterns BP1 and the second connection patterns BP2 may be formed of mesh lines MS or transparent patterns. The first connection patterns BP1 and the first sensor patterns SP1 may be disposed on the same layer and directly connected to each other, or on different layers and connected to each other through a predetermined contact hole. The second connection patterns BP2 and the second sensor patterns SP2 may be disposed on the same layer and directly connected to each other, or on different layers and connected to each other through a predetermined contact hole. A detailed description thereof will be given later.

The signal lines SL are disposed in the peripheral region NAA and electrically connect the circuit board PCB and the sensor electrodes TX and RX to each other. Meanwhile, this is illustrated as an example, and in the electronic apparatus 1000 according to an embodiment of the inventive concept, a driving circuit configured to drive the sensor electrodes TX and RX may be disposed in a panel. In this case, the circuit board PCB may be omitted.

The peripheral region NAA is disposed adjacent to the active region AA. Although an electrical signal is applied to the peripheral region NAA, the peripheral region NAA does not provide a function of displaying an image to the outside or sensing an external input.

The peripheral region NAA may be a region in which signal lines configured to provide the active region AA with a signal applied from the outside or driving elements configured to drive the active region AA are disposed. The peripheral region NAA may be disposed adjacent to one side of the active region AA.

In this embodiment, the peripheral region NAA is illustrated as having a shape surrounding the active region AA. However, this is illustrated as an example, and in the electronic apparatus 1000 according to an embodiment of the inventive concept, the peripheral region NAA may be omitted. For example, the peripheral region NAA may be disposed only in the second portion R2 or the third portion R3 and may not disposed in the first portion RE The peripheral region NAA may be defined as having various shapes, and the inventive concept is not limited to any one embodiment.

The signal lines SL may be respectively connected to the sensor electrodes TX and RX. In addition, the signal lines SL may include signal lines which are not connected to the sensor electrodes TX and RX. Specifically, FIG. 3C illustrates an embodiment of the arrangement structure of the signal lines SL. The signal lines SL may be designed to be divided into two groups, a left group and a right group, based on the center of a panel PN. For example, a group of the signal lines SL disposed on the left side receives an electrical signal through a first pad region TPA1, and a group of the signal lines SL disposed on the right side receives an electrical signal through a second pad region TPA2. According to the inventive concept, the area of the peripheral region NAA may be reduced by dividing the signal lines SL into the two groups.

Referring to FIG. 3C, the signal lines SL may include a plurality of first signal lines T1 to Tn connected to the first sensor electrodes TX, a plurality of second signal lines R1 to R1 connected to the second sensor electrodes RX, a plurality of electrical discharge lines P1 to P4, and a plurality of guard lines S1 to S6. FIG. 3C exemplarily illustrates four first signal lines T1, Tm, Tm+1, and Tn among the first signal lines T1 to Tn and four second signal lines R1, Rk, Rk+1, and R1 among the second signal lines R1 to R1.

The first signal lines T1 to Tm connected to m number of the first sensor electrodes TX1 to TXm among the first sensor electrodes TX may be disposed on the right side with respect to the center of the panel PN, and the first signal lines Tm+1 to Tn connected to the sensor electrodes from the m+1-th first sensor electrode TXm+1 to the n-th first sensor electrode TXn among the first sensor electrodes TX may be disposed on the left side with respect to the center of the panel PN. In addition, the connection between the m number of the first sensor electrodes TX1 to TXm and the first signal lines T1 to Tm may be designed to be made at the upper right side, and the connection between the sensor electrodes from the m+1-th first sensor electrode TXm+1 to the n-th first sensor electrode TXn and the first signal lines Tm+1 to Tn may be designed to be made at the lower left side.

The second signal lines R1 to Rk connected to k number of the second sensor electrodes RX1 to RXk among the second sensor electrodes RX may be disposed on the left side with respect to the center of the panel PN, and the second signal lines Rk+1 to R1 connected to the sensor electrodes from the k+1-th second sensor electrode RXk+1 to the 1-th second sensor electrode RX1 among the second sensor electrodes RX may be disposed on the right side with respect to the center of the panel PN. In addition, the connection between the k number of the second sensor electrodes RX1 to RXk and the second signal lines R1 to Rk may be designed to be made at the lower right side, and the connection between the sensor electrodes from the k+1-th second sensor electrode RXk+1 to the 1-th second sensor electrode RX1 and the second signal lines Rk+1 to R1 may be designed to be made at the upper left side.

The electrical discharge lines P1 to P4 may be configured to transmit a shielding signal and prevent static electricity. Since the signal lines SL include the electrical discharge lines P1 to P4, the electrical reliability of the electronic apparatus 1000 is improved.

The electrical discharge lines P1 to P4 may be disposed on the outermost side among the signal lines SL. For example, a first electrical discharge line P1 among the electrical discharge lines P1 to P4 may be disposed at the outermost left side of the left group among the signal lines SL. A second electrical discharge line P2 may be disposed at the outermost right side of the left group among the signal lines SL. A third electrical discharge line P3 may be disposed at the outermost right side of the right group among the signal lines SL. A fourth electrical discharge line P4 may be disposed at the outermost left side of the right group among the signal lines SL.

The guard lines S1 to S6 may electrically shield signal lines configured to apply different types of signals. When the signal lines configured to apply different types of signals are disposed adjacent to each other, the influence which is exerted on each other may be prevented by the guard lines S1 to S6. Accordingly, the noise generation and electrical reliability of the electronic apparatus 1000 may be improved.

The guard lines S1 to S6 are disposed between adjacent signal lines configured to apply different types of signals. For example, a first guard line S1 among the guard lines S1 to S6 is disposed between the first electrical discharge line P1 and the 1-th first second signal line R1. A second guard line S2 is disposed between the k+1-th second signal line Rk+1 and the n-th first signal line Tn.

A third guard line S3 is disposed between the second electrical discharge line P2 and the m+1-th first signal line Tm+1. A fourth guard line S4 is disposed between the third electrical discharge line P3 and the m-th first signal line Tm. A fifth guard line S5 is disposed between the k-th second signal line Rk and the 1-th first signal line T1. A sixth guard line S6 is disposed between the 1-th second signal lines R1 and the fourth electrical discharge line P4.

According to the inventive concept, through the arrangement design of the signal lines SL, it is possible to provide uniform touch sensitivity in the entire active region AA, reduce noise, and reduce the area of the peripheral region NAA. Meanwhile, the electronic apparatus 1000 according to an embodiment of the inventive concept may include the signal lines SL having various arrangement structures, and the inventive concept is not limited to any one embodiment.

Figure 4:
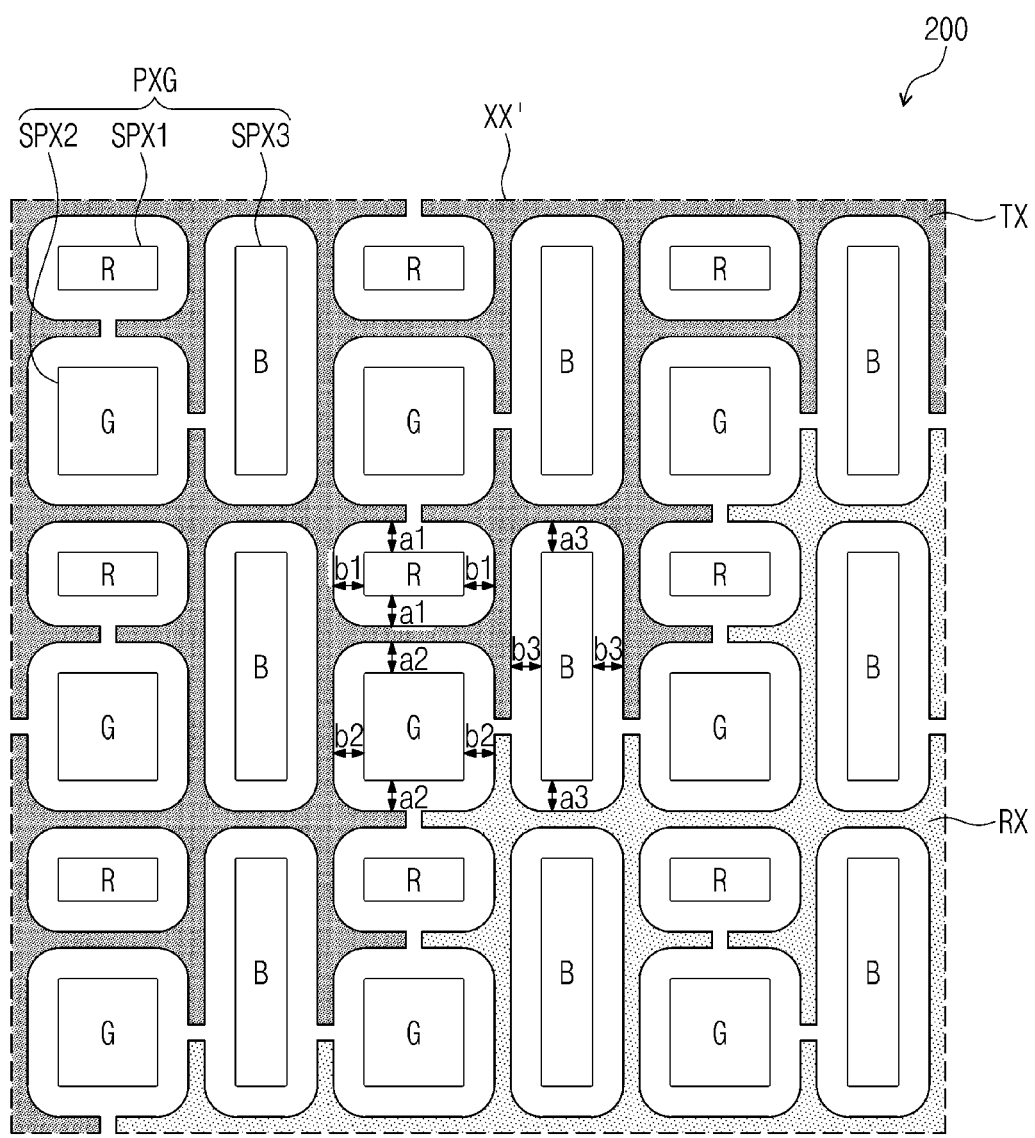
FIG. 4 is a plan view illustrating region XX' illustrated in FIG. 3A.
Figure 5A:
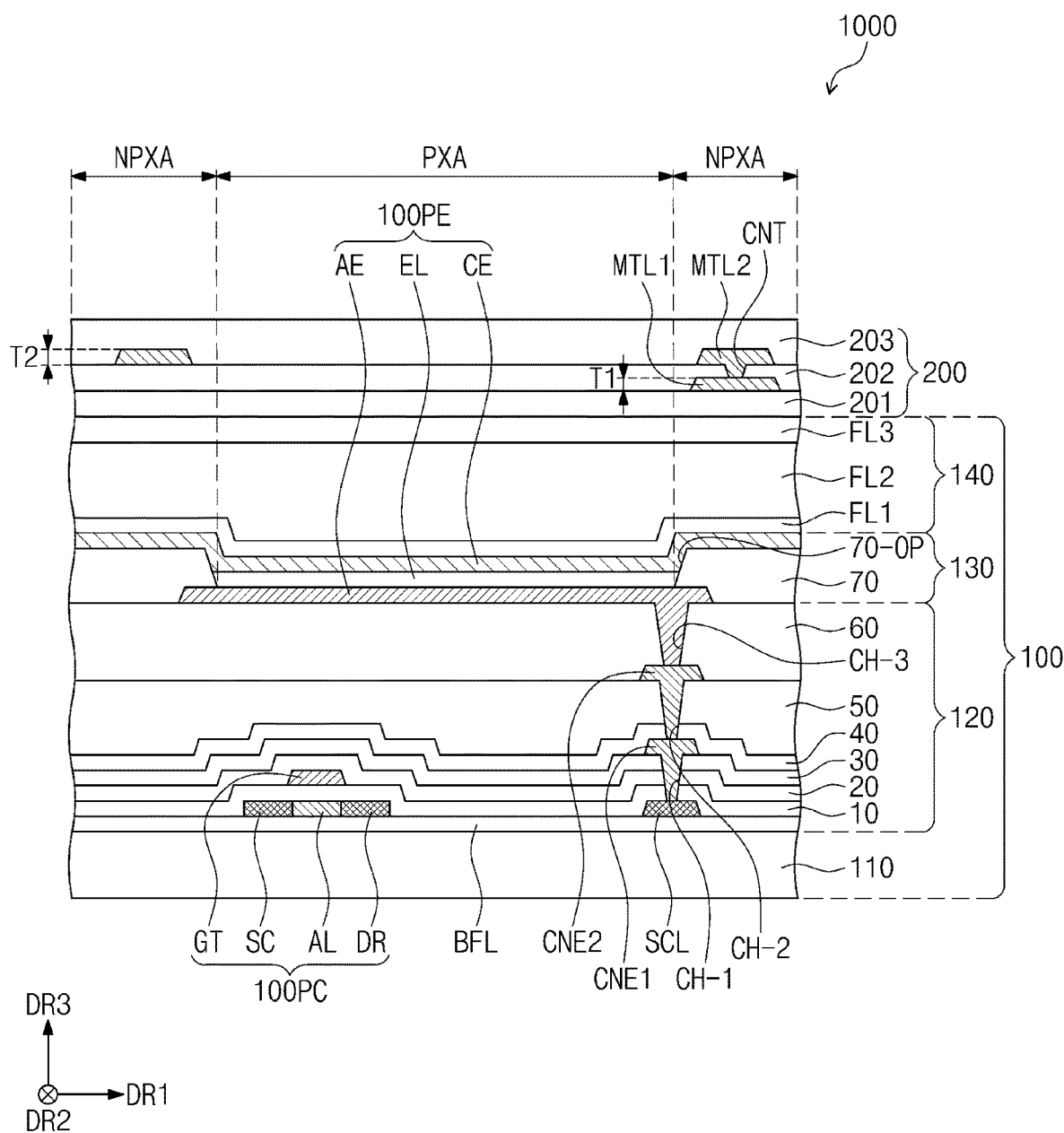
FIGS. 5A and 5B are cross-sectional views illustrating partial regions of the electronic apparatus according to an embodiment of the inventive concept.
Figure 5B:
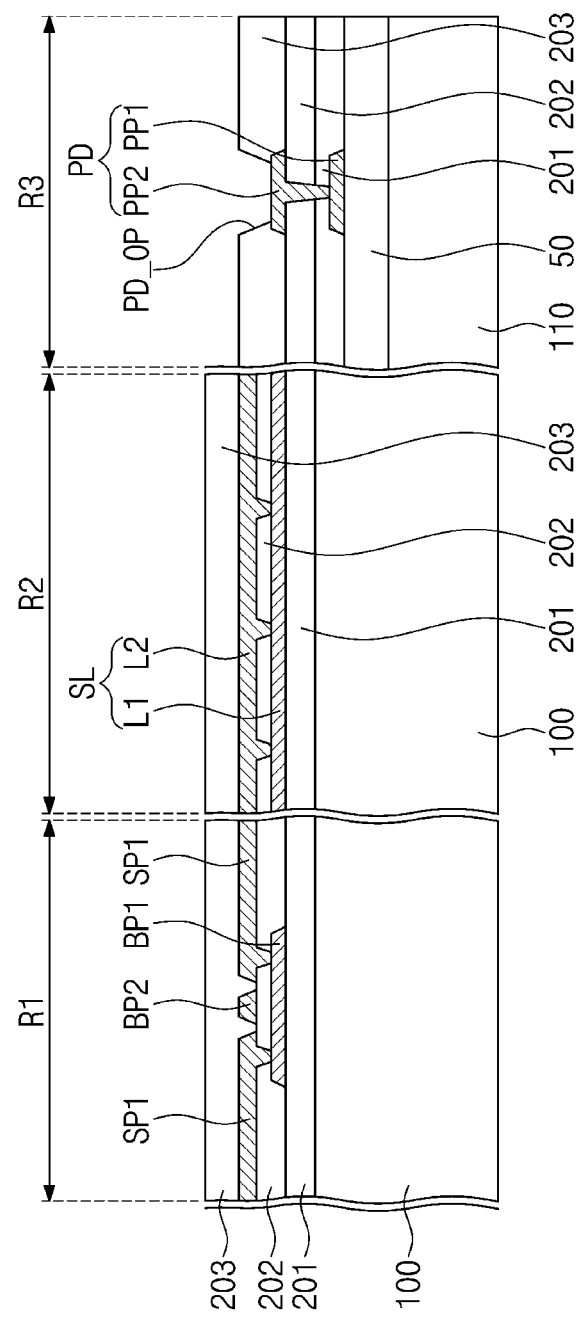

FIG. 4 is a plan view illustrating region XX' illustrated in FIGS. 3A and 3B. FIGS. 5A and 5B are cross-sectional views illustrating partial regions of the electronic apparatus according to an embodiment of the inventive concept. Hereinafter, the inventive concept will be described with reference to FIGS. 4 to 5B.

FIG. 4 illustrates an input sensing layer 200, and a plurality of light-emitting pixels PXG each of which includes a plurality of sub-pixels SPX1, SPX2, and SPX3 are illustrated as having a shape corresponding to the light-emitting region. As illustrated in FIG. 4, each of the first sensor electrode TX and the second sensor electrode RX may include mesh lines. The mesh lines have a plurality of openings which expose the plurality of sub-pixels SPX1, SPX2, and SPX3. Accordingly, the mesh lines may have a shape surrounding the edges of the plurality of sub-pixels SPX1, SPX2, and SPX3.

The light-emitting pixels PXG may be arranged in a matrix shape defined by the first direction DR1 and the second direction DR2. That is, the light-emitting pixels PXG may be arranged along the first direction DR1 and the second direction DR2.

In this embodiment, the shape of each of the sub-pixels SPX1, SPX2, and SPX3 may correspond to each of the light-emitting regions. The sub-pixels SPX1, SPX2, and SPX3 are illustrated as tetragonal shapes having different areas, but this is illustrated as an example, and the sub-pixels SPX1, SPX2, and SPX3 may have a same light-emitting area or a shape other than a tetragon, and the inventive concept is not limited to any one embodiment.

The sub-pixels SPX1, SPX2, and SPX3 may emit light of different colors. In this embodiment, the sub-pixels SPX1, SPX2, and SPX3 may include a first sub-pixel SPX1 that emits red light, a second sub-pixel SPX2 that emits green light, and a third sub-pixel SPX3 that emits blue light. Accordingly, one light-emitting pixel PXG may emit white light. Meanwhile, this is illustrated as an example, and the color combinations of light emitted by each of the first to third sub-pixels SPX1, SPX2, and SPX3 may be provided in various ways, and the inventive concept is not limited to any one embodiment.

The sub-pixels SPX1, SPX2, and SPX3 may be arranged in the first direction DR1 and in the second direction DR2. For example, among the sub-pixels SPX1, SPX2, and SPX3, the first sub-pixel SPX1 and the second sub-pixel SPX2 may be spaced apart from each other in the second direction DR2, and the third sub-pixel SPX3 may be disposed to be spaced apart from each of the first sub-pixel SPX1 and the second sub-pixel SPX2 in the first direction DR1. Meanwhile, the arrangement structure of the sub-pixels SPX1, SPX2, and SPX3 may be variously changed.

The mesh lines may be disposed between the light-emitting regions. A distance a1 in the second direction DR2 and a distance b1 in the first direction DR1 between the first sub-pixel SPX1 and the mesh line may be designed in various ways. The distance a1 in the second direction DR2 and the distance b1 in the first direction DR1 between the first sub-pixel SPX1 and the mesh line may be the same as or different from each other. In addition, in this embodiment, the distance a1 between the first sub-pixel SPX1 and the mesh line in the second direction DR2 is uniformly illustrated, but this is illustrated as an example, and with respect to the first sub-pixel SPX1, the distances from the upper and lower sides to the mesh line may be different from each other. Similarly, the distances from the left and right sides of the first sub-pixel SPX1 to the mesh line may be different from each other.

The distances a2 and b2 between the second sub-pixel SPX2 and the mesh line and the distances a3 and b3 between the third sub-pixel SPX3 and the mesh line may be designed independently of each other in various ways, and the inventive concept is not limited to any one embodiment. According to the inventive concept, since the sensor electrodes TX and RX are designed not to cover the light-emitting pixels PXG, it is possible to prevent the deterioration of the display characteristics of the electronic apparatus 1000 due to the input sensing layer 200.

FIG. 5A is a cross-sectional view illustrating a partial region of one sub-pixel, and FIG. 5B is a cross-sectional view illustrating a plurality of regions together. FIG. 5B is a cross-sectional view of the first portion R1, the second portion R2, and the third portion R3 illustrated in FIGS. 3A to 3B, and some elements are omitted. Hereinafter, the inventive concept will be described with reference to FIGS. 5A and 5B.

A light-emitting region PXA illustrated in FIG. 5A may correspond to the light-emitting region of any one of the sub-pixels SPX1, SPX2, and SPX3. A non-light-emitting region NPXA may correspond to a region between the light-emitting regions PXA, and the aforementioned mesh line may be disposed in the non-light-emitting region NPXA.

Referring to FIG. 5A, the electronic apparatus 1000 may include a display panel 100 (hereinafter referred to as a display layer) and an input sensing layer 200 (hereinafter referred to as a sensing layer). The display layer 100 may be configured to substantially generate an image. The display layer 100 may be a light-emitting display layer, and for example, the display layer 100 may be an organic light-emitting display layer, a quantum dot display layer, a micro LED display layer, or a nano LED display layer. Hereinafter, as an example, the display layer 100 will be described as an organic light-emitting display layer, but is not particularly limited thereto.

The sensing layer 200 may be disposed on the display layer 100. The sensing layer 200 may sense an external input applied from the outside. The sensing layer 200 may be formed on the display layer 100 through a continuous process. In this case, it may be expressed that the sensing layer 200 is directly disposed on the display layer 100. The expression "directly disposed" may mean that a third element is not disposed between the sensing layer 200 and the display layer 100. That is, an additional adhesive layer may not be disposed between the sensing layer 200 and the display layer 100.

The display layer 100 may include a base layer 110, a circuit layer 120, a light-emitting element layer 130, and an encapsulation layer 140.

The base layer 110 may provide a base surface on which the circuit layer 120 is disposed. The base layer 110 may be a glass substrate, a metal substrate, or a polymer substrate. However, the embodiment of the inventive concept is not limited thereto, and the base layer 110 may be an inorganic layer, an organic layer, or a composite material layer.

The base layer 110 may have a multi-layered structure. For example, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

Each of the first and second synthetic resin layers may contain a polyimide-based resin. In addition, each of the first and second synthetic resin layers may contain an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. Meanwhile, in this specification, "~~"-based resin means to include a functional group of "~~".

The circuit layer 120 may be disposed on the base layer 110. The circuit layer 120 may include an insulating layer, a semiconductor pattern, a conductive pattern, and a signal line. An insulating layer, a semiconductor layer, and a conductive layer are formed on the base layer 110 by coating, deposition, or the like, and then, the insulating layer, the semiconductor layer, and the conductive layer may be selectively patterned through a plurality of photolithography processes. Hereafter, a semiconductor pattern, a conductive pattern, and a signal line which are included in the circuit layer 120 may be formed.

At least one inorganic layer is formed on the upper surface of the base layer 110. The inorganic layer may contain at least one of aluminum oxide, titanium oxide, silicon oxide, silicon nitride, silicon oxynitride, zirconium oxide, or hafnium oxide. The inorganic layer may be formed in multiple layers. The multi-layered inorganic layers may constitute a barrier layer and/or a buffer layer. In this embodiment, the display layer 100 is illustrated to include a buffer layer BFL.

The buffer layer BFL may improve a bonding force between the base layer 110 and the semiconductor pattern. The buffer layer BFL may contain at least one of silicon oxide, silicon nitride, or silicon oxynitride. For example, the buffer layer BFL may include a structure in which a silicon oxide layer and a silicon nitride layer are alternately stacked.

The semiconductor pattern may be disposed on the buffer layer BFL. The semiconductor pattern may contain polysilicon. However, the embodiment of the inventive concept is not limited thereto, and the semiconductor pattern may contain amorphous silicon, low-temperature polycrystalline silicon, or an oxide semiconductor.

FIG. 5A only partially illustrates a semiconductor pattern, and a semiconductor pattern may be further disposed in another region. The semiconductor pattern may be arranged in a specific rule across the pixels. The semiconductor pattern may have different electrical properties depending on whether it is doped or not. The semiconductor pattern may include a first region having high conductivity and a second region having low conductivity. The first region may be doped with an N-type dopant or a P-type dopant. A P-type transistor may include a doped region doped with a P-type dopant, and an N-type transistor may include a doped region doped with an N-type dopant. The second region may be a non-doped region or a region doped at a lower concentration than the first region.

The conductivity of the first region is greater than that of the second region and may substantially serve as an electrode or a signal line. The second region may substantially correspond to an active (or channel) of a transistor. In other words, a portion of the semiconductor pattern may be an active of a transistor, another portion thereof may be a source or drain of a transistor, and still another portion thereof may be a connection electrode or a connection signal line.

Each of the pixels may have an equivalent circuit including seven transistors, one capacitor, and a light-emitting element, and the equivalent circuit diagram of a pixel may be modified in various forms. FIG. 4 exemplarily illustrates one transistor 100PC and a light-emitting element 100PE included in the pixel.

A source SC, an active AL, and a drain DR of the transistor 100PC may be formed from a semiconductor pattern. The source SC and the drain DR may extend in opposite directions from the active AL on a cross sectional view. FIG. 4 illustrates a portion of a connection signal line SCL formed from the semiconductor pattern. Although not illustrated separately, the connection signal line SCL may be connected to the drain DR of the transistor 100PC in a plan view.

A first insulating layer 10 may be disposed on the buffer layer BFL. The first insulating layer 10 may overlap a plurality of pixels in common and cover the semiconductor pattern. The first insulating layer 10 may be an inorganic layer and/or an organic layer and have a single-layered or multi-layered structure. The first insulating layer 10 may contain at least one of aluminum oxide, titanium oxide, silicon oxide, silicon nitride, silicon oxynitride, zirconium oxide, or hafnium oxide. In this embodiment, the first insulating layer 10 may be a single-layered silicon oxide layer. The insulating layer of the circuit layer 120 to be described later as well as the first insulating layer 10 may be an inorganic layer and/or an organic layer and have a single-layered or multi-layered structure. The inorganic layer may include at least one of the above-described materials, but is not limited thereto.

The gate GT of the transistor 100PC is disposed on the first insulating layer 10. The gate GT may be a portion of the metal pattern. The gate GT overlaps the active AL. In the process of doping the semiconductor pattern, the gate GT may function as a self-aligned mask.

A second insulating layer 20 may be disposed on the first insulating layer 10 and cover the gate GT. The second insulating layer 20 may be disposed in the pixel areas in common. The second insulating layer 20 may be an inorganic layer and/or an organic layer and have a single-layered or multi-layered structure. The second insulating layer 20 may contain at least one of silicon oxide, silicon nitride, or silicon oxynitride. In this embodiment, the second insulating layer 20 may have a multi-layered structure including a silicon oxide layer and a silicon nitride layer.

A third insulating layer 30 may be disposed on the second insulating layer 20. The third insulating layer 30 may have a single-layered or multi-layered structure. For example, the third insulating layer 30 may have a multi-layered structure including a silicon oxide layer and a silicon nitride layer. The third insulating layer 30 may be an optional layer which can be omitted.

A first connection electrode CNE1 may be disposed on the third insulating layer 30. The first connection electrode CNE1 may be connected to the connection signal line SCL through a contact hole CH-1 passing through the first, second, and third insulating layers 10, 20, and 30.

A fourth insulating layer 40 may be disposed on the third insulating layer 30. The fourth insulating layer 40 may be a single-layered silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CH-2 passing through the fourth and fifth insulating layers 40 and 50.

A sixth insulating layer 60 may be disposed on the fifth insulating layer 50 and cover the second connection electrode CNE2. The sixth insulating layer 60 may be an organic layer.

The light-emitting element layer 130 may be disposed on the circuit layer 120. The light-emitting element layer 130 may include a light-emitting element. For example, the light-emitting element layer 130 may contain an organic light-emitting material, quantum dots, quantum rods, micro LEDs, or nano LEDs. Hereinafter, as an example, the light-emitting element 100PE is described as an organic light-emitting element, but is not particularly limited thereto.

The light-emitting element 100PE may include a first electrode AE, a light-emitting layer EL, and a second electrode CE.

The first electrode AE may be disposed on the sixth insulating layer 60. The first electrode AE may be connected to the second connection electrode CNE2 through a contact hole CH-3 passing through the sixth insulating layer 60.

A pixel defining layer 70 may be disposed on the sixth insulating layer 60 and cover a portion of the first electrode AE. The pixel defining layer 70 has an opening 70-OP defined therein. The opening 70-OP of the pixel defining layer 70 exposes at least a portion of the first electrode AE. In this embodiment, the light-emitting region PXA is defined to correspond to a region of the first electrode AE exposed by the opening 70-OP.

The light-emitting layer EL may be disposed on the first electrode AE. The light-emitting layer EL may be disposed in a region corresponding to the opening 70-OP. That is, the light-emitting layer EL may be separately formed in each of the pixels. When the light-emitting layer EL is separately formed in each of the pixels, each of the light-emitting layers EL may emit light of at least one color of blue, red, or green. However, the embodiment of the inventive concept is not limited thereto, and the light-emitting layer EL may be connected to commonly cover a plurality of pixels and provided in common. In this case, the light-emitting layer EL may provide blue light or white light.

The second electrode CE may be disposed on the light-emitting layer EL. The second electrode CE may have an integral shape and be commonly disposed in the plurality of pixels.

Although not illustrated, a hole control layer may be disposed between the first electrode AE and the light-emitting layer EL. The hole control layer may be commonly disposed in the light-emitting region PXA and the non-light-emitting region NPXA. The hole control layer may include a hole transport layer and may further include a hole injection layer. An electron control layer may be disposed between the light-emitting layer EL and the second electrode CE. The electron control layer may include an electron transport layer and may further include an electron injection layer. The hole control layer and the electron control layer may be commonly formed in the plurality of pixels by using an open mask.

The encapsulation layer 140 may be disposed on the light-emitting element layer 130. The encapsulation layer 140 may include a first inorganic layer FL1, an organic layer FL2, and a second inorganic layer FL3 which are sequentially stacked, but the layers constituting the encapsulation layer 140 are not limited thereto.

The first and second inorganic layers FL1 and FL3 may protect the light-emitting element layer 130 from moisture and oxygen, and the organic layer FL2 may protect the light-emitting element layer 130 from foreign substances such as dust particles. The first and second inorganic layers FL1 and FL3 may include a silicon nitride layer, a silicon oxynitride layer, a silicon oxide layer, a titanium oxide layer, an aluminum oxide layer, or the like. The organic layer FL2 may include an acryl-based organic layer, but is not limited thereto.

The sensing layer 200 may include a plurality of conductive layers MTL1 and MTL2, an upper base layer 201, an intermediate insulating layer 202, and a cover insulating layer 203.

The upper base layer 201 may be an inorganic layer containing at least one of silicon nitride, silicon oxynitride, or silicon oxide. Alternatively, the upper base layer 201 may be an organic layer containing an epoxy resin, an acrylic resin, or an imide-based resin. The upper base layer 201 may have a single-layered structure or a multi-layered structure stacked along the third direction DR3.

The conductive layers MTL1 and MTL2 may include a first conductive layer MTL1 and a second conductive layer MTL2. The first conductive layer MTL1 may be disposed between the upper base layer 201 and the intermediate insulating layer 202, and the second conductive layer MTL2 may be disposed between the intermediate insulating layer 202 and the cover insulating layer 203. A portion of the second conductive layer MTL2 may be connected to the first conductive layer MTL1 through a contact hole CNT formed in the intermediate insulating layer 202. Each of the conductive layers MTL1 and MTL2 may have a single-layered structure or a multi-layered structure stacked along the third direction DR3. In this embodiment, a thickness T1 (hereinafter referred to as a first thickness) of the first conductive layer MTL1 may be relatively smaller than a thickness T2 (hereinafter referred to as a second thickness) of the second conductive layer MTL2. In this embodiment, the first conductive layer MTL1 may constitute any one of the first connection pattern BP1 and the second connection pattern BP2 which are described above, and the second conductive layer MTL2 may constitute the other one of the first connection pattern BP1 and the second connection pattern BP2, the first sensor pattern SP1, and the second sensor pattern SP2. That is, the second conductive layer MTL2 occupying a major area of the sensor region of the sensing layer 200 may be formed to be thicker than the first conductive layer MTL1 constituting a bridge. Accordingly, while the sensing sensitivity of the sensing region is improved, the thickness of the conductive layer having little influence on the sensing sensitivity may be reduced. However, this has been described as an example, and the first thickness T1 and the second thickness T2 may vary depending on the design of the sensing layer 200, and the inventive concept is not limited to any one embodiment.

The single-layered conductive layer may include a metal layer or a transparent conductive layer. The metal layer may contain molybdenum, silver, titanium, copper, aluminum, or an alloy thereof. The transparent conductive layer may contain a transparent conductive oxide such as an indium tin oxide (ITO), an indium zinc oxide (IZO), a zinc oxide (ZnO), or an indium zinc tin oxide (IZTO). In addition, the transparent conductive layer may contain a conductive polymer such as PEDOT, metal nanowire, graphene, and the like.

The multi-layered conductive layer may include metal layers. The metal layers may have, for example, a three-layer structure of titanium/aluminum/titanium. The multi-layered conductive layer may include at least one metal layer and at least one transparent conductive layer.

The cover insulating layer 203 may include an inorganic film. The inorganic film may contain at least one of aluminum oxide, titanium oxide, silicon oxide, silicon nitride, silicon oxynitride, zirconium oxide, or hafnium oxide.

Alternatively, the cover insulating layer 203 may include an organic film. The organic film may contain at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

The cross-sectional structure of the sensing layer 200 will be described in more detail with reference to FIG. 5B. Meanwhile, in FIG. 5B, some of the elements of the display layer 100 are omitted for ease of description. As described above, the active region AA is disposed in the first portion RE FIG. 5B illustrates a region corresponding to region YY' of the first portion R1 illustrated in FIG. 3B. In this embodiment, the first connection pattern BP1 is disposed between the upper base layer 201 and the intermediate insulating layer 202 to constitute the first conductive layer MTL1, and the second connection pattern BP2, the first sensor pattern SP1, and the second sensor pattern SP2 are disposed between the intermediate insulating layer 202 and the cover insulating layer 203 to constitute the second conductive layer MTL2.

The signal line SL of the sensing layer 200 is disposed in the second portion R2. As described above, the signal line SL may be any one of the first signal lines T1 to Tn (refer to FIG. 3C), the second signal lines R1 to R1 (refer to FIG. 3C), the electrical discharge lines P1 to P4 (refer to FIG. 3C), and the guard lines S1 to S6 (refer to FIG. 3C).

In this embodiment, the signal line SL has a multi-layered structure. The signal line SL may include a first layer L1 constituting the first conductive layer MTL1 and a second layer L2 constituting the second conductive layer MTL2. The second layer L2 may be connected to the first layer L1 through at least one contact hole formed in the intermediate insulating layer 202. Since the signal line SL has a multi-layered structure, it is possible to reduce a resistance of the signal line and defect due to a disconnection of the first layer L1 or the second layer L2 may be prevented. Meanwhile, this is illustrated as an example, and the signal line SL may be provided in a single-layered structure. For example, the signal line SL may be disposed in the first conductive layer MTL1 or the second conductive layer MTL2, and the inventive concept is not limited to any one embodiment.

In the third portion R3, a pad PD may be disposed in the sensing layer 200. The pad PD may be disposed in the pad regions TPA1 and TPA2 illustrated in FIG. 3C to connect a driving circuit such as a circuit board PCB (refer to FIG. 3A) and a signal line SL to each other. In this embodiment, the pad PD may have a multi-layered structure including a first pattern portion PP1 and a second pattern portion PP2. The first pattern portion PP1 may be disposed between the fifth insulating layer 50 of the display layer 100 and the upper base layer 201, and the second pattern portion PP2 may be disposed between the intermediate insulating layer 202 and the cover insulating layer 203. Although not illustrated, the first pattern portion PP1 may be connected to an edge of the signal line SL or to the signal line SL in another region. The second pattern portion PP2 may pass through the upper base layer 201 and the intermediate insulating layer 202 to be connected to the first pattern portion PH. Meanwhile, at least a portion of the upper surface of the second pattern portion PP2 may be exposed from the cover insulating layer 203 through an opening PD_OP formed in the cover insulating layer 203. A connector CTR or a terminal of a separately provided driving circuit may be electrically connected to the signal line SL through the exposed upper surface of the second pattern portion PP2.

Figure 6A:
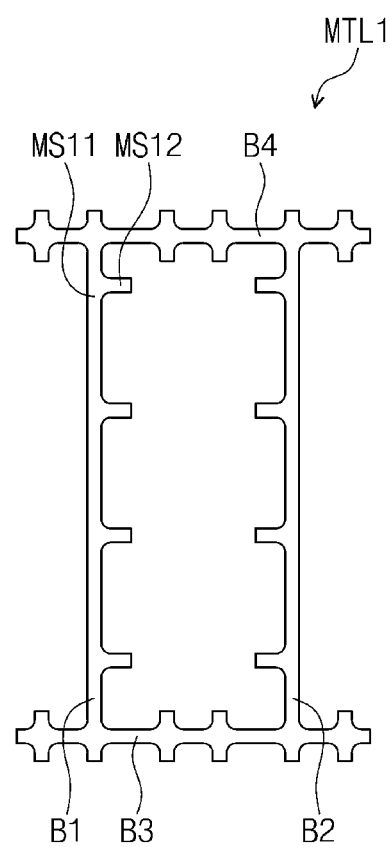
FIGS. 6A, 6B and 6C are plan views illustrating a part of the electronic apparatus according to an embodiment of the inventive concept.
Figure 6B:
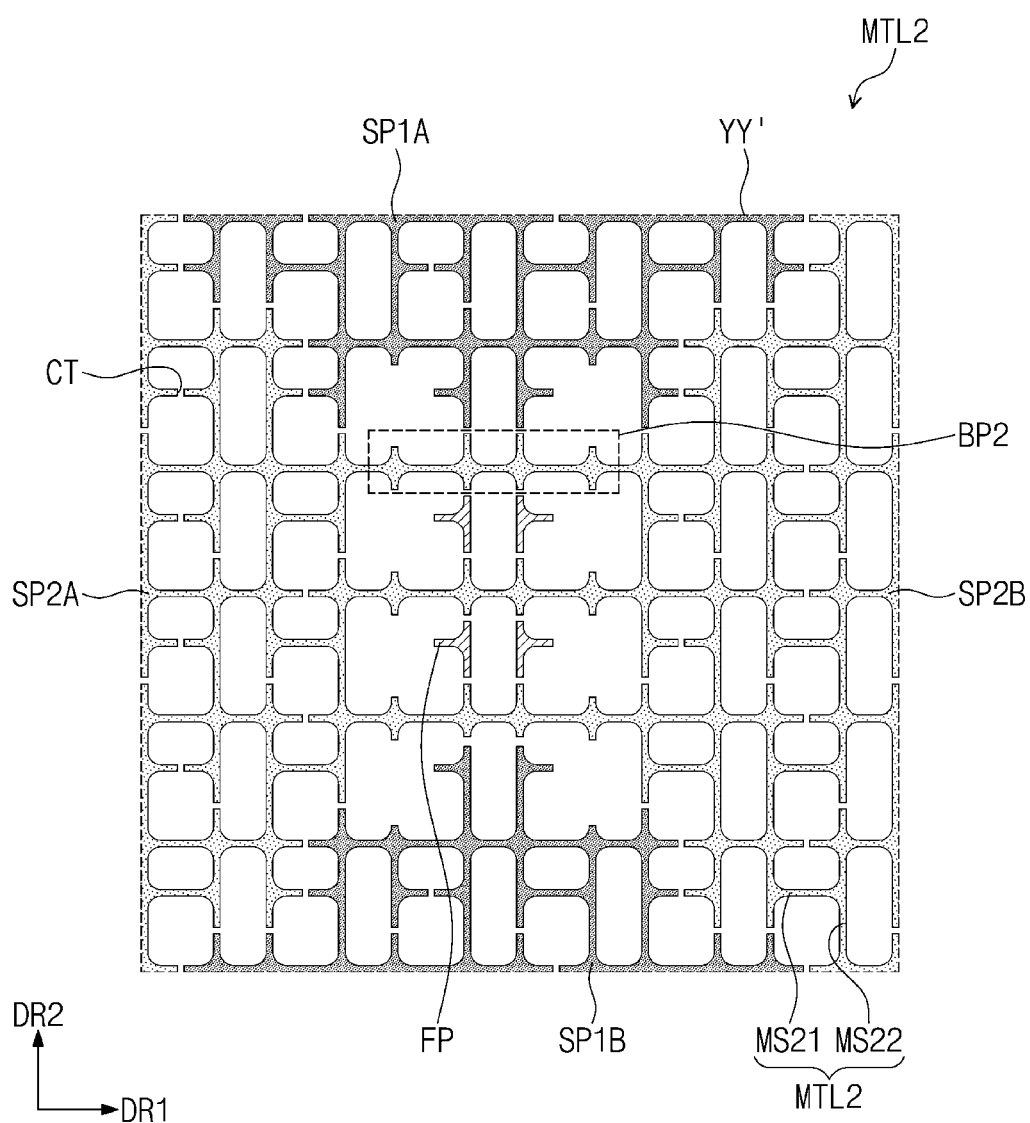
Figure 6C:
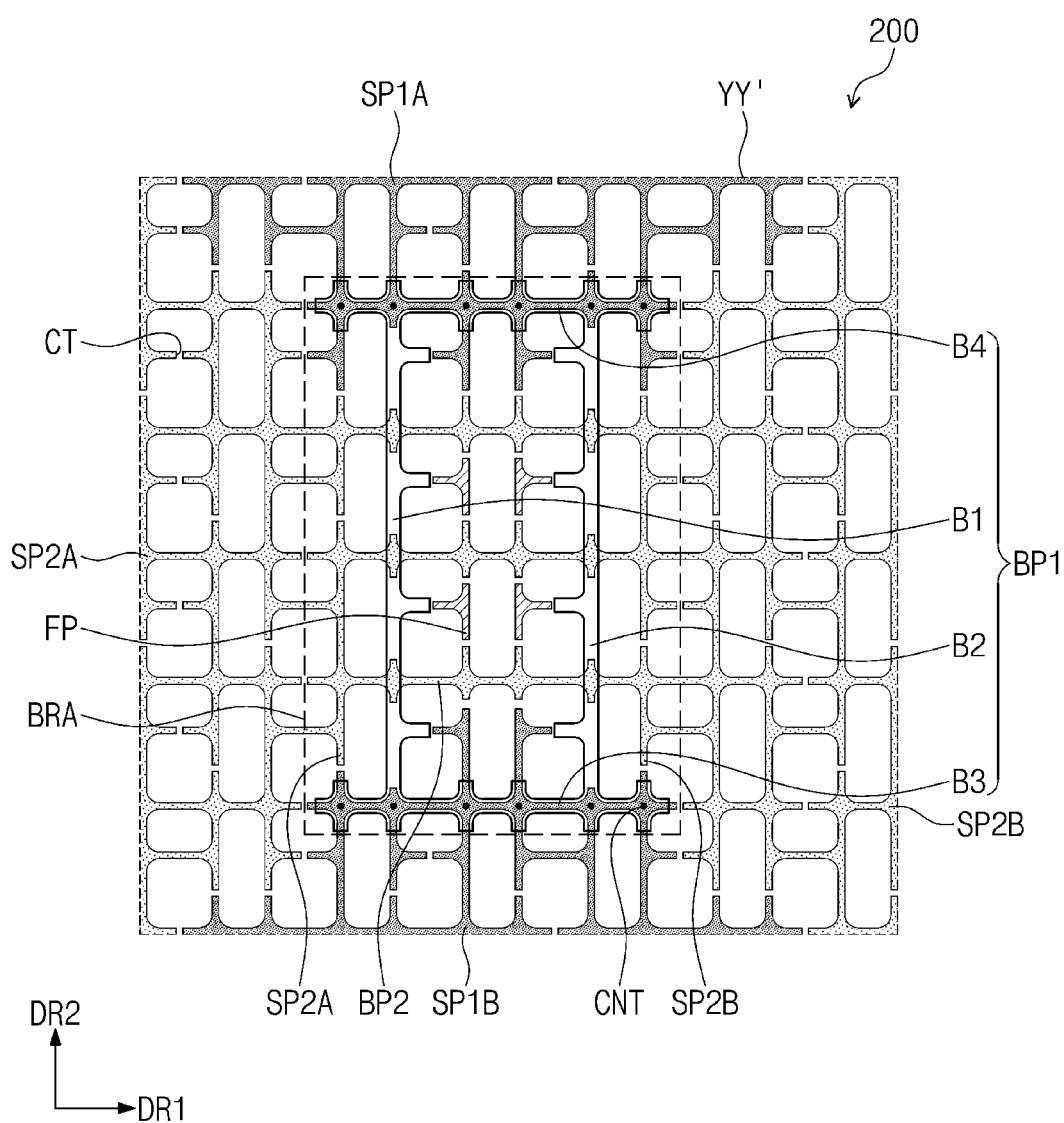

FIGS. 6A to 6C are plan views illustrating a part of the electronic apparatus according to an embodiment of the inventive concept. FIGS. 6A to 6C illustrate region YY' illustrated in FIGS. 3A and 3B. FIG. 6A illustrates the first conductive layer MTL1, FIG. 6B illustrates the second conductive layer MTL2, and FIG. 6C illustrates the sensing layer 200. Hereinafter, the design of the sensing layer 200 will be described in more detail with reference to FIGS. 6A to 6C.

Referring to FIGS. 6A and 6C, the first conductive layer MTL1 may correspond to the first connection pattern BP1. In this embodiment, the first connection pattern BP1 is disposed on a layer different from a layer on which the first sensor pattern SP1 is disposed and is connected to the first sensor pattern SP1 through contact holes CNT formed through the insulating intermediate layer 202.

The first connection pattern BP1 may be formed of mesh lines MS11 and MS12. That is, the first connection pattern BP1 may be formed of a plurality of mesh lines MS11 and MS12 which are connected to each other. The mesh lines MS11 and MS12 may include a first mesh line MS11 extending along the first direction DR1 and a second mesh line MS12 extending along the second direction DR2 from the first mesh line MS11. The first connection pattern BP1 may have an integral shape in which the first mesh line MS11 and the second mesh line MS12 are connected to each other.

The first connection pattern BP1 may include first to fourth patterns B1, B2, B3, and B4. A first pattern B1 may generally have a bar shape extending along the second direction DR2. A second pattern B2 extends along the second direction DR2 and is spaced apart from the first pattern B1 in the first direction DR1. The second pattern B2 may also have a bar shape corresponding to the first pattern B1. The first pattern B1 and the second pattern B2 may be symmetrical to each other with respect to a first symmetric axis passing through a center of the first conductive layer MTL1 along a second direction DR2.

A third pattern B3 and a fourth pattern B4 are spaced apart from each other in the second direction DR2 and respectively extend along the first direction DR1. Each of the third pattern B3 and the fourth pattern B4 may generally have a bar shape extending along the first direction DR1. The third pattern B3 and the fourth pattern B4 may be symmetrical to each other with respect to a second symmetric axis passing through a center of the first conductive layer MTL1 along a first direction DR1.

Referring to FIGS. 6B and 6C, the second conductive layer MTL2 may include a plurality of first sensor patterns SP1A and SP1B, a plurality of second sensor patterns SP2A and SP2B, and a second connection pattern BP2. The second connection pattern BP2 is disposed in the same layer as the second sensor patterns SP2A and SP2B to be directly connected to the second sensor patterns SP2A and SP2B. In this embodiment, the second sensor patterns SP2A and SP2B and the second connection pattern BP2 may have an integral shape in which they are connected to each other.

The first sensor patterns SP1A and SP1B are disposed to be spaced apart from each other in the second direction DR2. The first connection pattern BP1 is disposed to be insulated from and cross the second connection pattern BP2 and electrically connects the first sensor patterns SP1A and SP1B which are spaced apart from each other.

The second conductive layer MTL2 may also be formed of mesh lines MS. That is, each of the first sensor patterns SP1A and SP1B, the second sensor patterns SP2A and SP2B, and the second connection pattern BP2 may be connected to a first mesh line MS21 extending along the first direction DR1 and a second mesh line MS22 extending along the second direction DR2.

Meanwhile, the first sensor patterns SP1A and SP1B and the second sensor patterns SP2A and SP2B may have predetermined cut portions CT defined therein. The cut portions CT are formed by removing portions of the mesh lines MS. The cut portions CT may be generally formed in the first sensor patterns SP1A and SP1B and the second sensor patterns SP2A and SP2B. Since the second conductive layer MTL2 further includes the cut portions CT, it is possible to prevent a problem that the boundary between the first sensor patterns SP1A and SP1B and the second sensor patterns SP2A and SP2B is visually recognized easily.

Meanwhile, the second conductive layer MTL2 may further include floating patterns FP. The floating patterns FP are spaced apart from the first sensor patterns SP1A and SP1B, the second sensor patterns SP2A and SP2B, and the second connection pattern BP2. In addition, the floating pattern FP is also electrically insulated from the first connection pattern BP1. The floating patterns FP may be disposed in a position in which the first connection pattern BP1 or the second connection pattern BP2 is not disposed, thereby providing uniform visibility. For example, the floating patterns FP may be portions of the second conductive layer MTL2 which is disconnected from the he second conductive layer MTL2. The floating patterns FP may be disposed in a region completely surrounded by the first conductive layer MTL1 and the second conductive layer MTL2 in a plan view.

Some of the mesh lines MS of the second conductive layer MTL2 overlapping the first connection pattern BP1 may be removed. According to the inventive concept, the sensing layer 200 may not be easily recognized by a user by minimizing the overlapping region of the first conductive layer MTL1 and the second conductive layer MTL2. In addition, since the formation of parasitic capacitance between the first conductive layer MTL1 and the second conductive layer MTL2 is minimized, noise generation may be reduced.

Figure 7A:
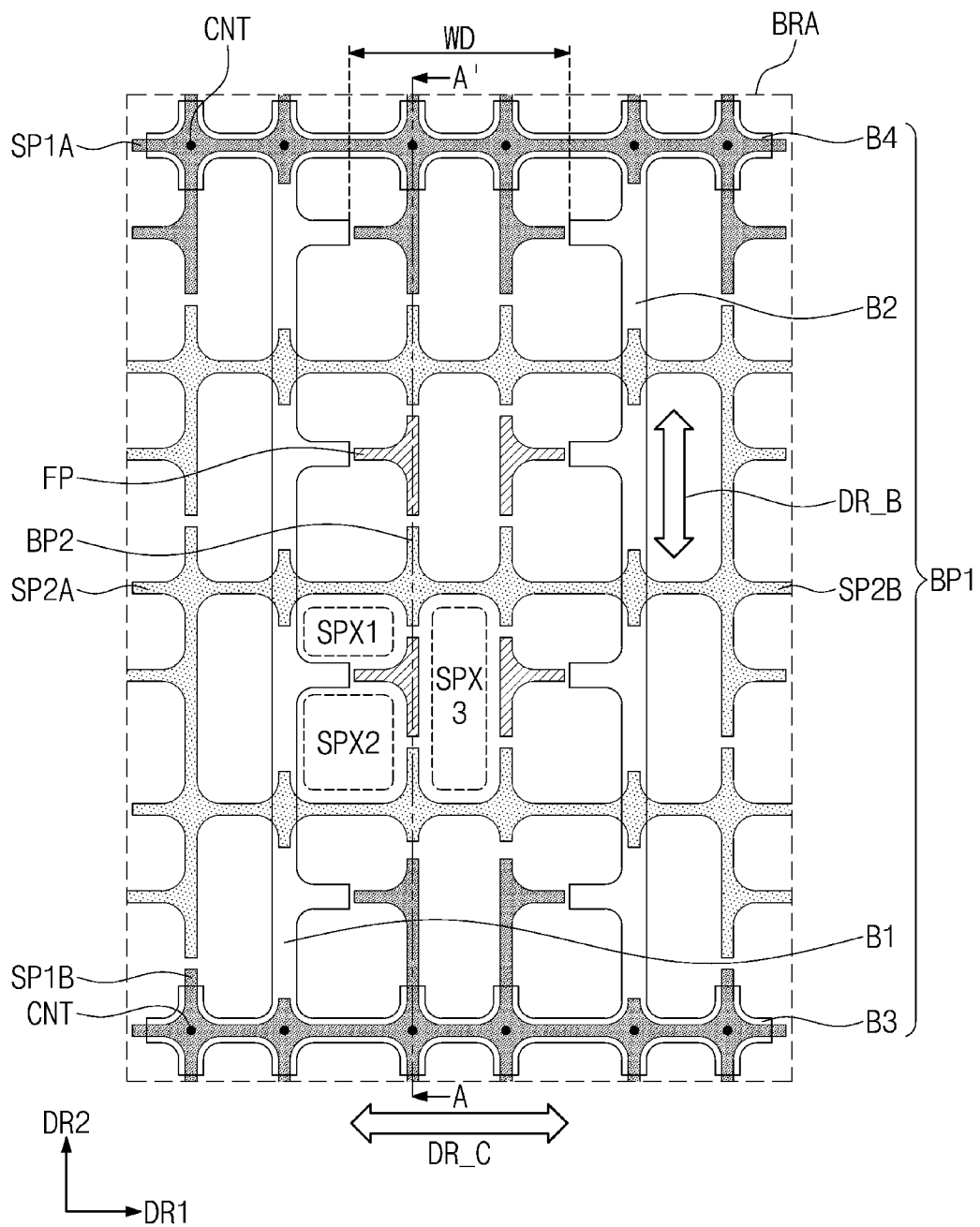
FIG. 7A is a plan view illustrating a part of the electronic apparatus according to an embodiment of the inventive concept.
Figure 7B:
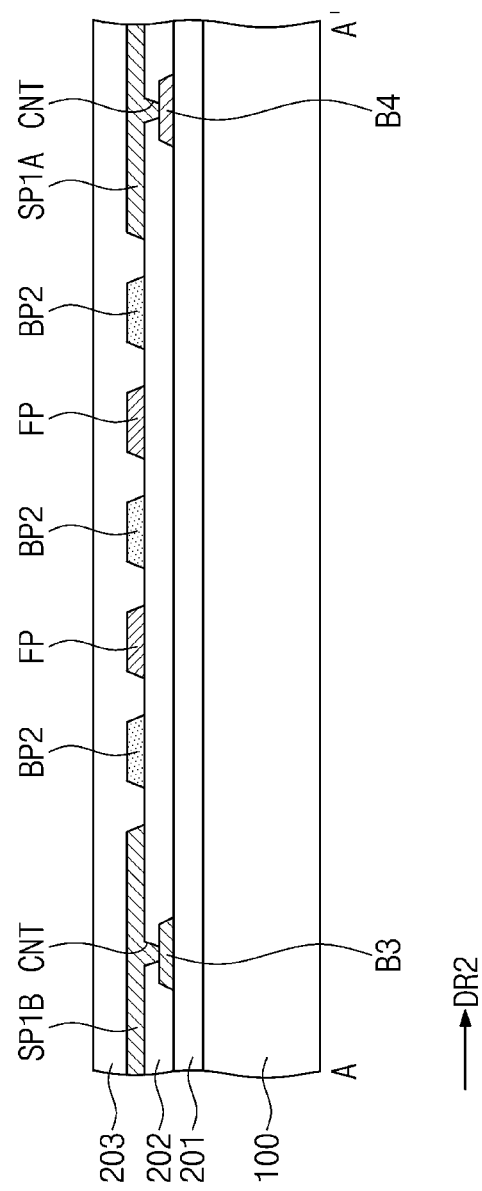
FIG. 7B is a cross-sectional view taken along line AA' illustrated in FIG. 7A.

FIG. 7A is a plan view illustrating a part of the electronic apparatus according to an embodiment of the inventive concept. FIG. 7B is a cross-sectional view taken along a line A-A' in FIG. 7A. FIG. 7A is an enlarged view of a bridge region BRA illustrated in FIG. 6C, and some elements are omitted in FIG. 7B. Hereinafter, the inventive concept will be described with reference to FIGS. 7A and 7B. Meanwhile, the same reference numerals will be given to the same elements as those described with reference to FIGS. 1 to 6C, and duplicated descriptions will be omitted.

Referring to FIG. 7A, the first sensor patterns SP1A and SP1B are electrically connected through the first pattern B1 and the second pattern B2. The first pattern B1 and the second pattern B2 are spaced apart from each other in the first direction DR1 and each thereof has a bar shape extending in the second direction DR2. Accordingly, a connection direction DR_B of the first sensor patterns SP1A and SP1B may be parallel to the second direction DR2.

A separation distance WD between the first pattern B1 and the second pattern B2 is defined in the first direction DR1. The separation distance WD between the first pattern B1 and the second pattern B2 may be equal to or greater than a pitch of at least one light-emitting pixel. As described above, one light-emitting pixel may be a unit including a plurality of sub-pixels SPX1, SPX2, and SPX3.

In this embodiment, in a region corresponding to the width WD between the first pattern B1 and the second pattern B2, one third sub-pixel SPX3, at least a half of one first sub-pixel SPX1 and a half of one second sub-pixel SPX2 disposed on one side of the third sub-pixel SPX3 along the first direction, and at least a half of one first sub-pixel SPX1 and a half of one second sub-pixel SPX2 disposed on the other side of the third sub-pixel SPX3 along the first direction may exist. That is, first connection pattern BP1 be greater than or equal to a width of one light-emitting pixel PXG. In addition, when viewed in the second direction DR2, it can be seen that four light-emitting pixels may exist in a space surround by the first connection pattern BP1. That is, in this embodiment, the first connection pattern BP1 may have an internal space in which pixels of 4 rows×1 column may be disposed. Meanwhile, as long as there is a space which is greater than or equal to a space in which one light-emitting pixel PXG can be disposed between the first pattern B1 and the second pattern B2, the width WD between the first pattern B1 and the second pattern B2 may be altered to have various widths, and the inventive concept is not limited to any one embodiment.

The floating patterns FP are disposed between the first pattern B1 and the second pattern B2. As described above, the floating patterns FP may be formed of the second conductive layer MTL2. Referring to FIG. 7B, the floating patterns FP and the second connection pattern BP2 are disposed between the first sensor patterns SP1A and SP1B in a plan view and between the intermediate insulating layer 202 and the cover insulating layer 203. The floating pattern FP constitutes the second conductive layer MTL2 and may be spaced apart and electrically insulated from the first sensor patterns SP1A and SP1B or the second connection pattern BP2 in a plan view.

Meanwhile, the first conductive layer MTL1 and the floating patterns FP do not overlap each other in a plan view. That is, the first conductive layer MTL1 is spaced apart from the floating patterns FP in a plan view. According to the inventive concept, in the bridge region BRA, a region in which the first conductive layer MTL1 and the second conductive layer MTL2 overlap each other in a plan view may be minimized. Accordingly, the bridge region BRA may not be easily recognized by the user.

Meanwhile, the connection between the first connection pattern BP1 and the first sensor patterns SP1A and SP1B may be made by the third pattern B3 and the fourth pattern B4. Referring to FIG. 7B, the third pattern B3 and the fourth pattern B4 constituting the first connection pattern BP1 are disposed between the upper base layer 201 and the intermediate insulating layer 202. The first sensor patterns SP1A and SP1B are respectively connected to the third pattern B3 and the fourth pattern B4 through the contact holes CNT formed in the intermediate insulating layer 202. Accordingly, the first connection pattern BP1 may be connected to the first sensor patterns SP1A and SP1B through the plurality of contact holes CNT. Each of the third pattern B3 and the fourth pattern B4 may extend along the first direction DR1, and an arrangement direction DR_C of the contact holes CNT may be parallel to the extension direction of each of the third pattern B3 and the fourth pattern B4. The arrangement direction DR_C of the contact holes CNT may cross the connection direction DR_B of the first sensor patterns SP1A and SP1B.

The length of each of the third and fourth patterns B3 and B4 may be greater than the separation distance WD between the first pattern B1 and the second pattern B2. Accordingly, although only the first pattern B1 and the second pattern B2 travers the second connection pattern BP2, the number of contact holes CNT may be provided without limitation. Therefore, it is possible to alleviate a problem that a connection failure between the first connection pattern BP1 and the first sensor patterns SP1A and SP1B occurs. Accordingly, the electrical reliability of the sensing layer 200 may be improved.

Figure 8A:
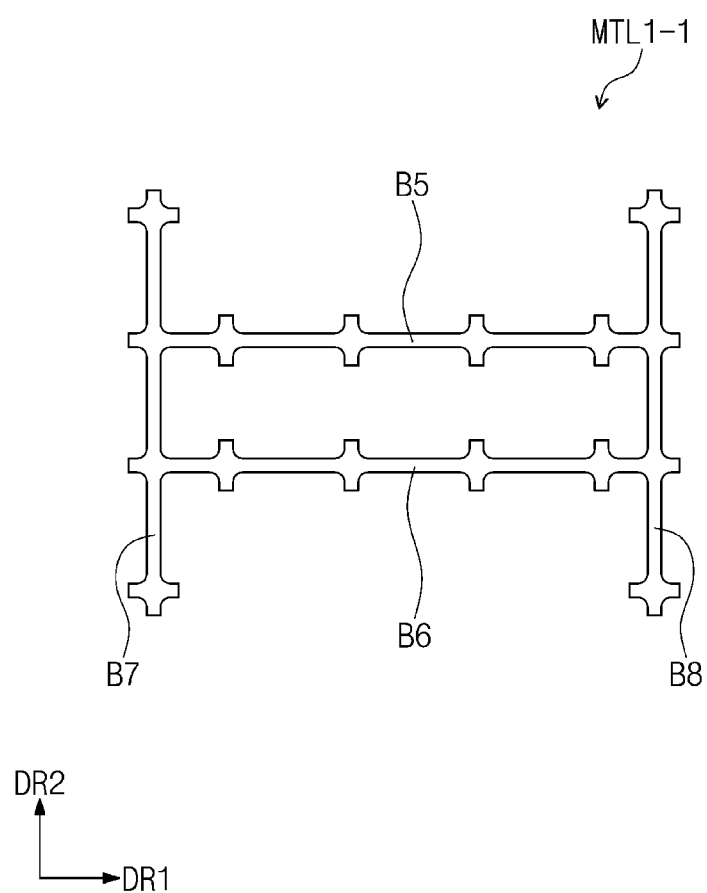
FIGS. 8A, 8B and 8C are plan views illustrating a part of the electronic apparatus according to an embodiment of the inventive concept.
Figure 8B:
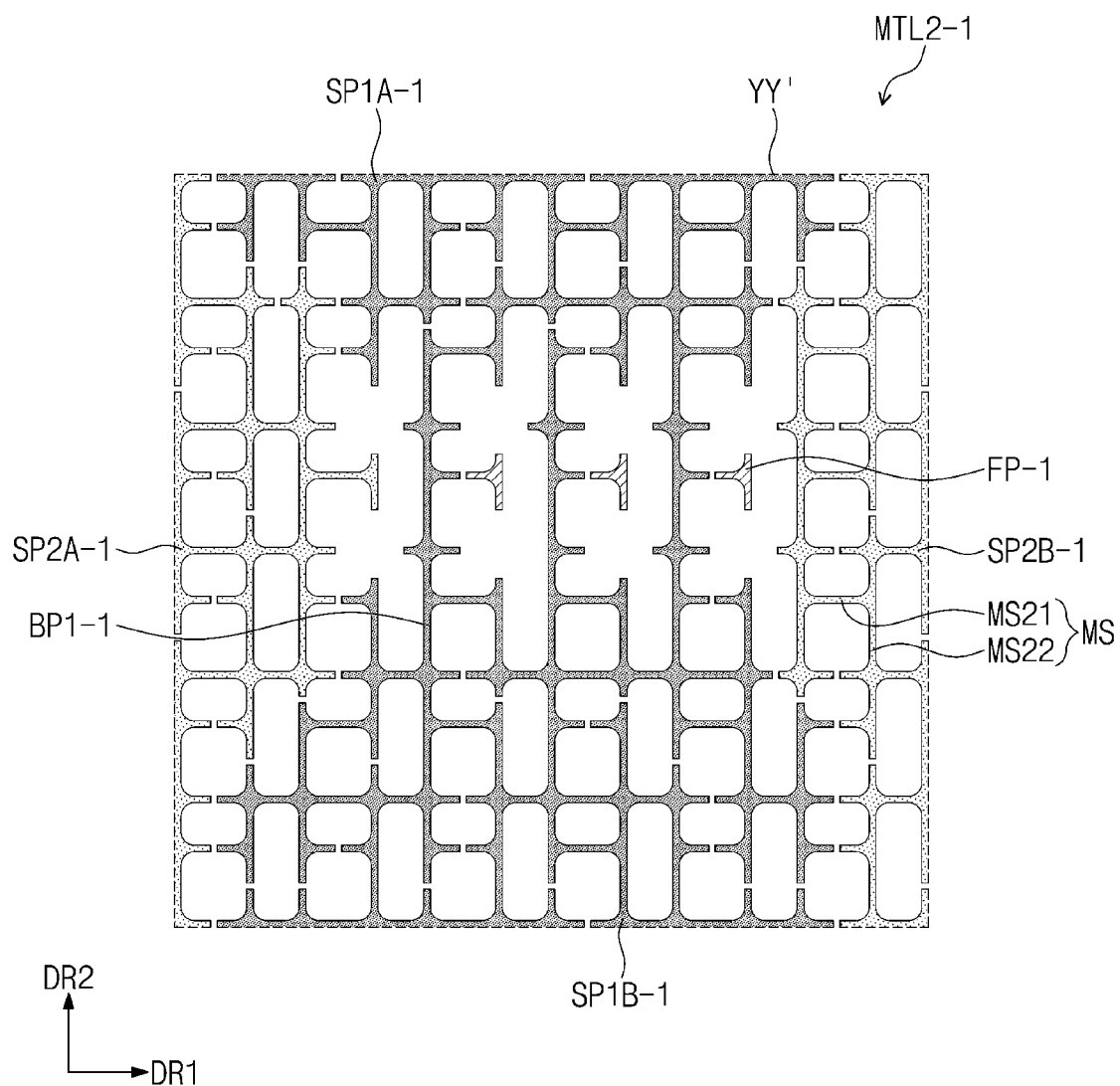
Figure 8C:
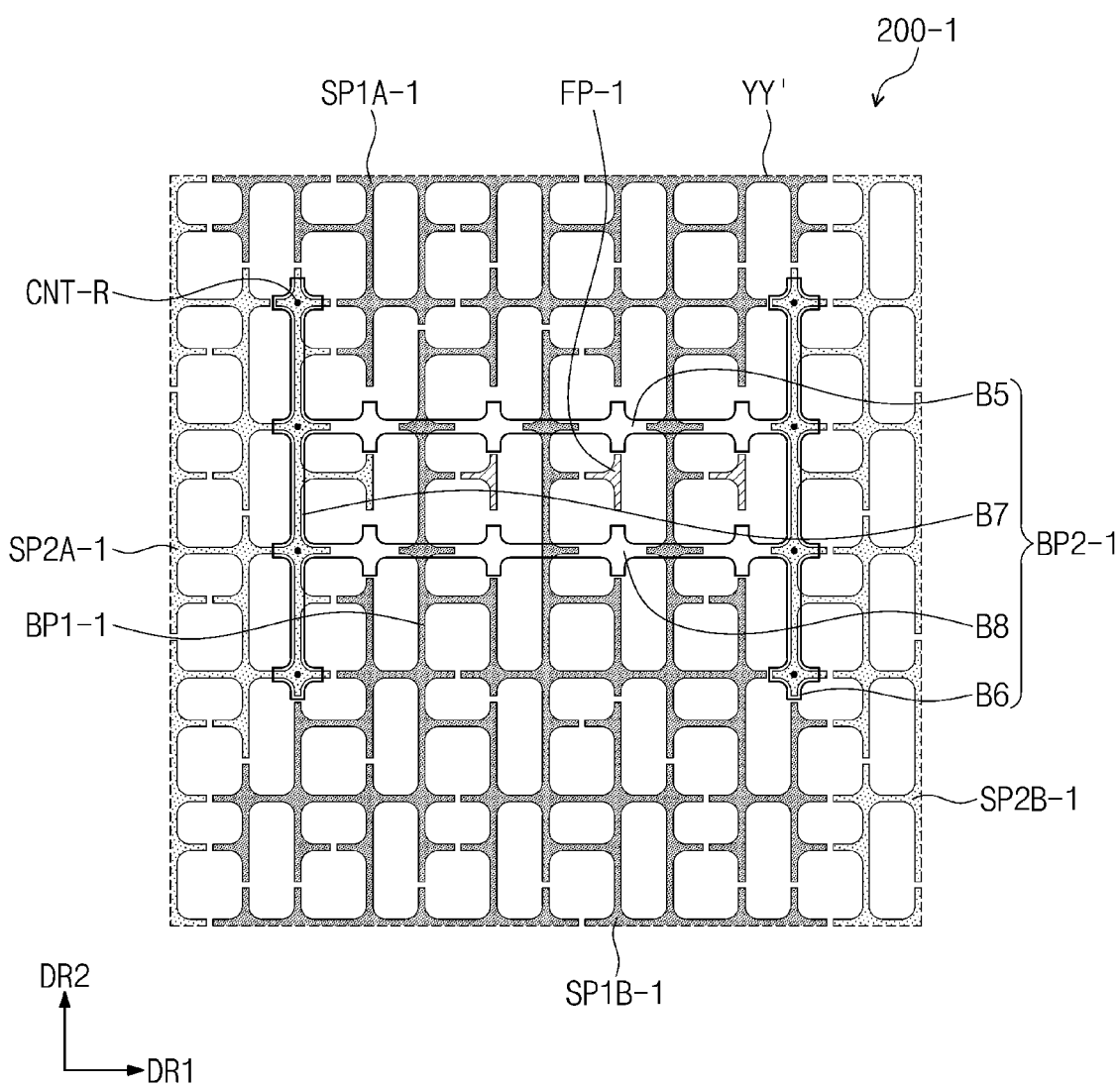

FIGS. 8A to 8C are plan views illustrating a part of the electronic apparatus according to an embodiment of the inventive concept. FIGS. 8A to 8C illustrate regions corresponding to those of FIGS. 6A to 6C, respectively. Hereinafter, a sensing layer 200-1 according to an embodiment of the inventive concept will be described with reference to FIGS. 8A to 8C.

Referring to FIGS. 8A and 8C, a first conductive layer MTL1-1 may correspond to a second connection pattern BP2-1. In this embodiment, the second connection pattern BP2-1 is disposed on a layer different from a layer on which second sensor patterns SP2A-1 and SP2B-1 are disposed and is connected to the second sensor patterns SP2A-1 and SP2B-1 through contact holes CNT-R.

The second connection pattern BP2-1 may include first to fourth patterns B5, B6, B7, and B8. A first pattern B5 may generally have a bar shape extending in the first direction DR1. A second pattern B6 extends along the first direction DR1 and is spaced apart from the first pattern B5 in the second direction DR2. The second pattern B6 may also have a bar shape corresponding to the first pattern B5.

A third pattern B7 and a fourth pattern B8 are spaced apart from each other in the first direction DR1 and respectively extend along the second direction DR2. Each of the third pattern B7 and the fourth pattern B8 may generally have a bar shape extending in the second direction DR2.

Referring to FIGS. 8B and 8C, a second conductive layer MTL2-1 may include a plurality of first sensor patterns SP1A-1 and SP1B-1, a plurality of second sensor patterns SP2A-1 and SP2B-1, and a first connection pattern BP1-1. The first connection pattern BP1-1 is disposed in the same layer as the first sensor patterns SP1A-1 and SP1B-1 to be directly connected thereto. In this embodiment, the first sensor patterns SP1A-1 and SP1B-1 and the first connection pattern BP1-1 may have an integral shape in which they are connected to each other.

In addition, the second conductive layer MTL2-1 includes a floating pattern FP-1. The floating pattern FP-1 is disposed in the same layer as the first sensor patterns SP1A-1 and SP1B-1, the first connection pattern BP1-1, and the second sensor patterns SP2A-1 and SP2B-1, and is spaced apart and electrically insulated from the first sensor patterns SP1A-1 and SP1B-1, the first connection pattern BP1-1, and the second sensor patterns SP2A-1 and SP2B-1. The floating pattern FP-1 is disposed on a layer different from a layer on which the second connection pattern BP2-1 is disposed.

The second sensor patterns SP2A-1 and SP2B-1 are disposed to be spaced apart from each other in the first direction DR1. The second connection pattern BP2-1 is disposed to be insulated from and cross the first connection pattern BP1-1 and electrically connects the second sensor patterns SP2A-1 and SP2B-1 to each other, which are spaced apart from each other in the first direction DR1.

According to the inventive concept, by connecting the second sensor patterns SP2A-1 and SP2B-1 through the two portions B5 and B6, the overlap between the first conductive layer MTL1-1 and the second conductive layers MTL2-1 in a plan view may be minimized. In addition, by forming the floating pattern FP-1 on a layer different from the layer on which the second connection pattern BP2-1 is disposed, the interference with the second connection pattern BP2-1 may be minimized.

By forming the contact portions CNT between the second sensor patterns SP2A-1 and SP2B-1 and the second connection pattern BP2-1 in the third and fourth portions B7 and B8, it is possible to minimize defects in electrical connection, which may be caused due to errors or the like in a process of the sensor patterns SP2A-1 and SP2B-1. Therefore, according to the inventive concept, it is possible for the pixel structure arranged along the first direction DR1 and the second direction DR2 to provide an electronic apparatus having improved visibility and electrical reliability.

Figure 9A:
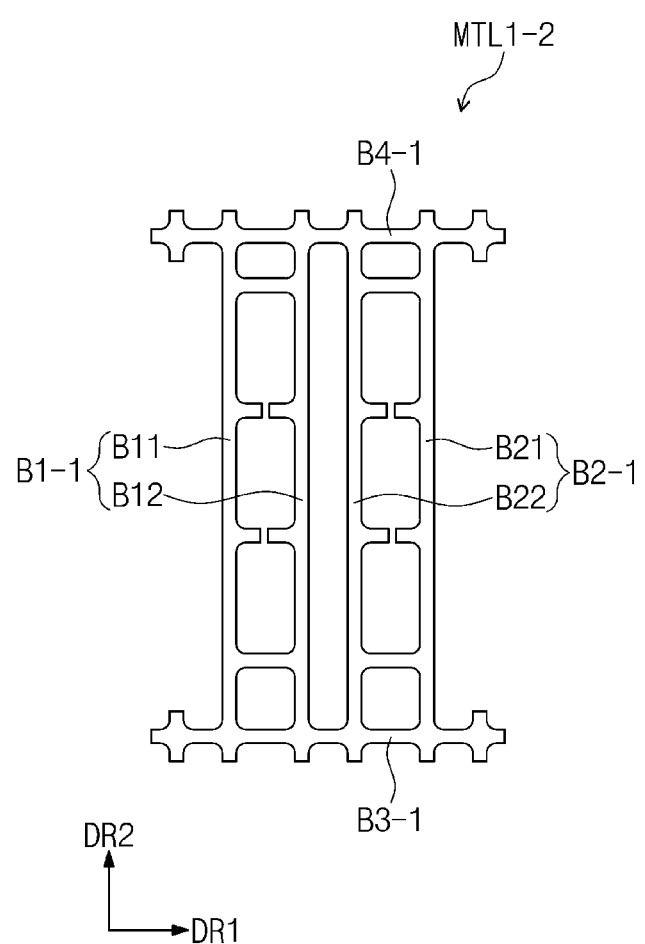
FIGS. 9A, 9B and 9C are plan views illustrating a part of the electronic apparatus according to an embodiment of the inventive concept.
Figure 9B:
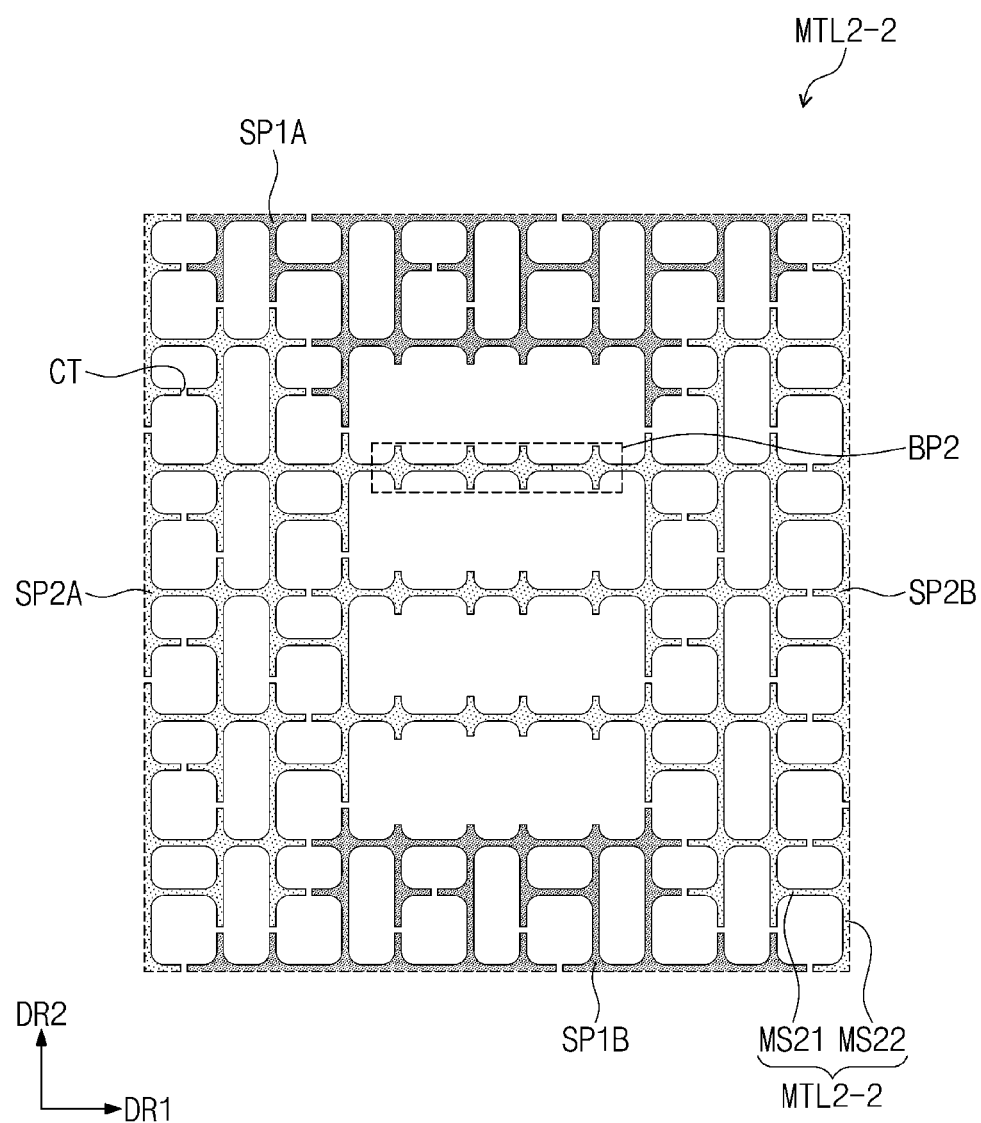
Figure 9C:
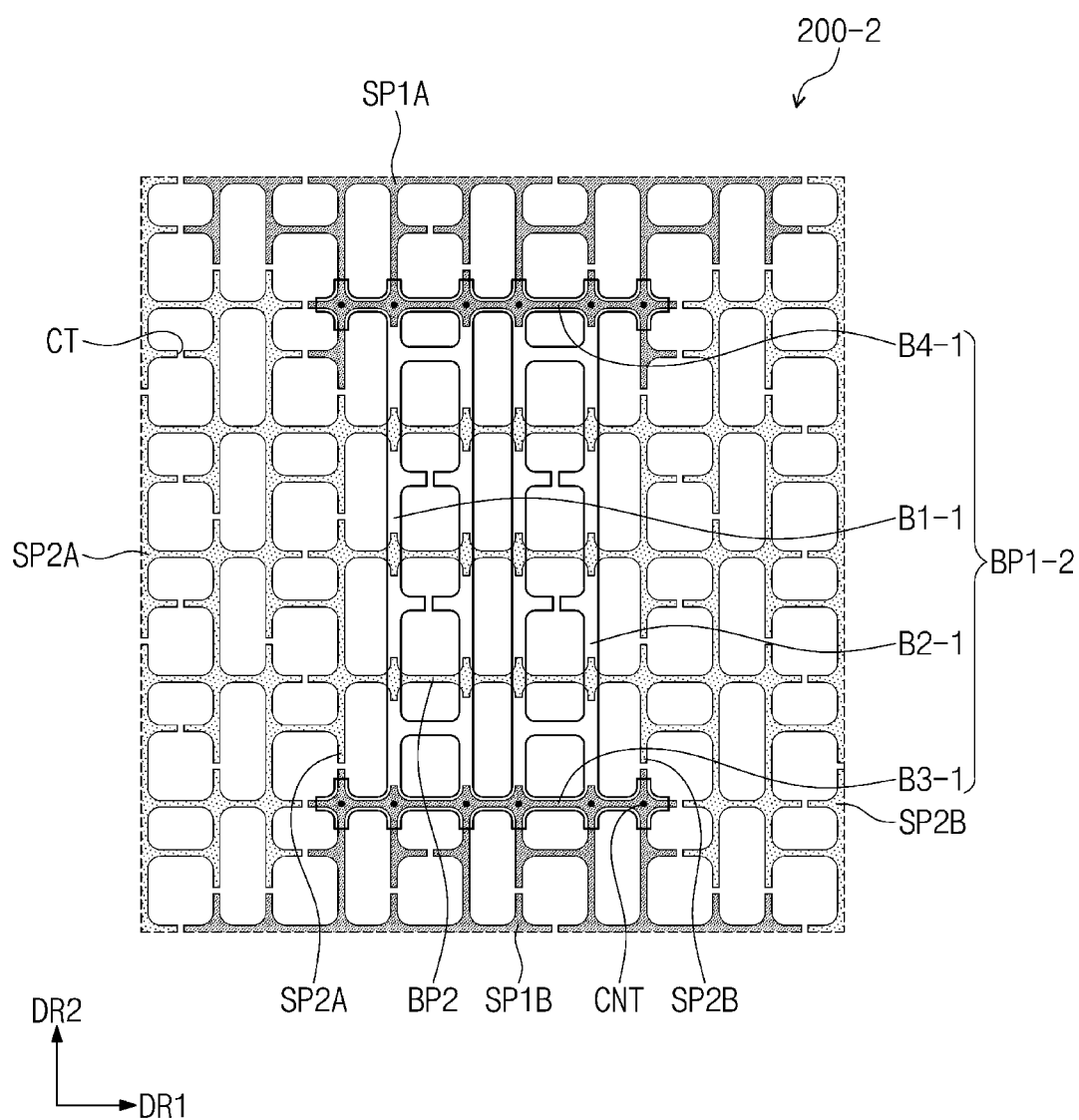

FIGS. 9A to 9C are plan views illustrating a part of the electronic apparatus according to an embodiment of the inventive concept. FIGS. 9A to 9C illustrate regions corresponding to those of FIGS. 6A to 6C, respectively. Hereinafter, a sensing layer 200-2 according to an embodiment of the inventive concept will be described with reference to FIGS. 9A to 9C.

Referring to FIGS. 9A and 9C, a first conductive layer MTL1-2 includes a first connection pattern BP1-2. The first connection pattern BP1-2 may include first to fourth patterns B1-1, B2-1, B3-1, and B4-1. Although the first to fourth patterns B1-1, B2-1, B3-1, and B4-1 correspond respectively to the first to fourth patterns B1, B2, B3, and B4 illustrated in FIGS. 6A and 6C, the shapes of the first and second patterns B1-1 and B2-1 may be different.

According to the inventive concept, the first pattern B1-1 may include a first portion B11 and a second portion B12, and the second pattern B2-1 may include a third portion B21 and a fourth portion B22. The first portion B11 and the second portion B12 are connected to each other, and the third portion B21 and the fourth portion B22 are connected to each other. That is, referring to FIGS. 9A to 9C, the first connection portion BP1-2 may connect the first sensor patterns SP1A and SP1B to each other through four bar-shaped portions.

According to the inventive concept, the first connection pattern BP1-2 may include a plurality of portions. For example, the first connection pattern BP1-2 may include three or more portions. Accordingly, although a disconnection defect occurs in some of the first to fourth portions B11, B12, B21, and B22, connection between the first sensor patterns SP1A and SP1B may be maintained, thus improving electrical reliability. That is, it is possible to minimize defects in electrical connection between the first sensor patterns SP1A and SP1B due to process errors or the like. Accordingly, according to the inventive concept, it is possible for the pixel structure arranged along the first direction DR1 and the second direction DR2 to provide an electronic apparatus having improved visibility and electrical reliability.

Figure 10:
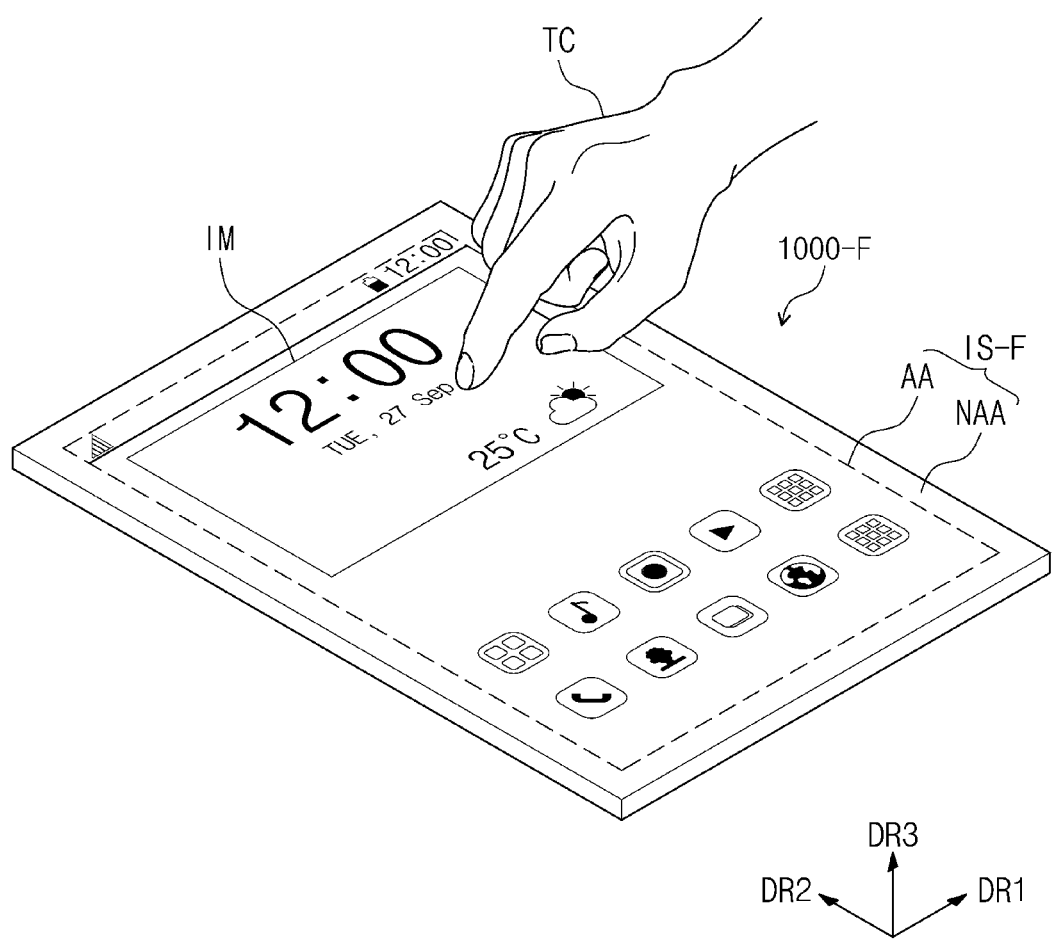
FIG. 10 is a perspective view of an electronic apparatus according to an embodiment of the inventive concept.

FIG. 10 is a perspective view of an electronic apparatus according to an embodiment of the inventive concept. An electronic apparatus 1000-F is activated by receiving an electrical signal. The electronic apparatus 1000-F activates a display surface IS-F in a plane defined by the first direction DR1 and the second direction DR2 according to the applied electrical signal. The display surface IS-F may include an active region AA and a peripheral region NAA in a plan view.

As described above, the active region AA may be electrically activated when an electrical signal is supplied. The active region AA may be activated to have various functions according to the purpose of the electronic apparatus EA.

For example, the active region AA may be a sensing region that senses an input applied from the outside. As illustrated in FIG. 10, the electronic apparatus 1000-F may sense an external input TC applied to the active region AA. In this regard, the electronic apparatus 1000-F may function as an input device.

Although the external input TC is exemplarily illustrated as a user's hand, an externally applied input may be provided in various forms. For example, the input may have various forms such as force, pressure, or light, as well as a touch or an adjacent touch by a part of a body such as a user's hand, and the inventive concept is not limited to any one embodiment.

Alternatively, for example, the active region AA may be a display region configured to display predetermined information. The electronic apparatus 1000-F may display an image IM on the active region AA, and a user may obtain information through the image. In this regard, the electronic apparatus 1000 may function as an output device.

The peripheral region NAA is disposed adjacent to the active region AA. The peripheral region NAA does not provide the function of displaying an image to the outside or sensing an external input although an electrical signal is applied thereto.

The peripheral region NAA may be a region in which signal lines configured to provide the active region AA with a signal applied from the outside or driving elements configured to drive the active region AA are disposed. The peripheral region NAA may be disposed adjacent to one side of the active region AA.

In this embodiment, the peripheral region NAA has a frame shape surrounding the active region AA. However, this is illustrated as an example, and in the electronic apparatus 1000 according to an embodiment of the inventive concept, the peripheral region NAA may be omitted. The peripheral region NAA may have various shapes and is not limited to any one embodiment.

FIG. 10 exemplarily illustrates a case in which the electronic apparatus 1000-F is a touch screen device. However, this is illustrated as an example, and a display function may be omitted in the electronic apparatus 1000-F.

FIGS. 11A to 11D are perspective views of an electronic apparatus according to an embodiment of the inventive concept. FIGS. 11A to 11D are perspective views illustrating various operations of the electronic apparatus 1000-F illustrated in FIG. 10. As illustrated in FIGS. 11A to 11D, the electronic apparatus 1000-F may be folded in various ways with respect to folding axes FX1 and FX2.

Figure 11A:
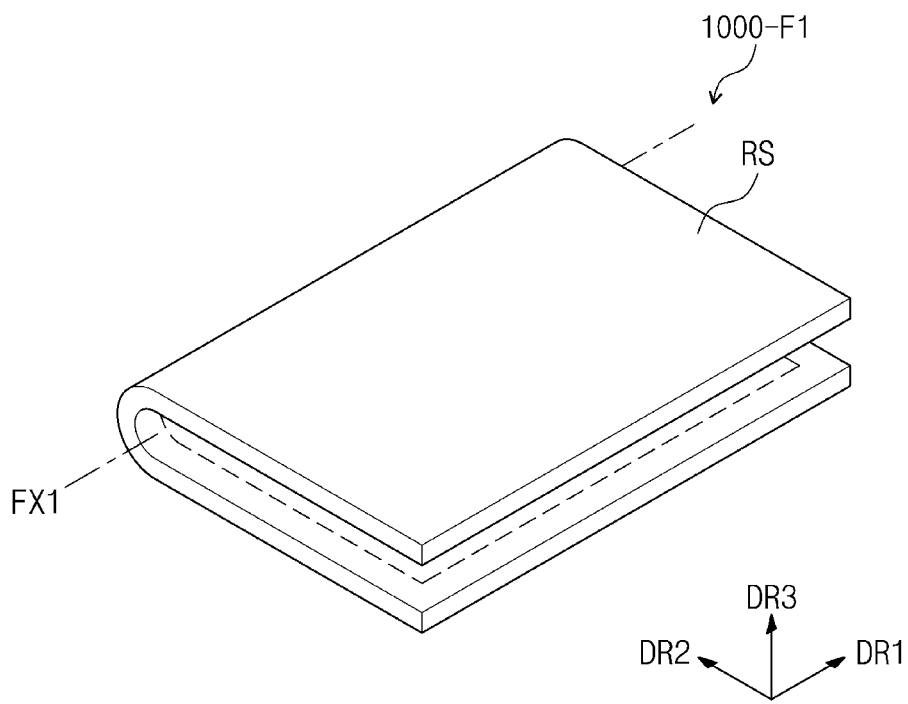
FIGS. 11A, 11B, 11C and 11D are perspective views of the electronic apparatus according to an embodiment of the inventive concept.

For example, as illustrated in FIG. 11A, an electronic apparatus 1000-F1 may be in-folded with respect to a first folding axis FX1 extending along the first direction DR1. The first direction DR1 may correspond to the width direction of the electronic apparatus 1000-F1. When the electronic apparatus 1000-F1 is folded, the active region AA (refer to FIG. 9) may not be viewed from the front side, and the rear surface RS of the electronic apparatus 1000-F1 may be viewed from the front side.

Figure 11B:
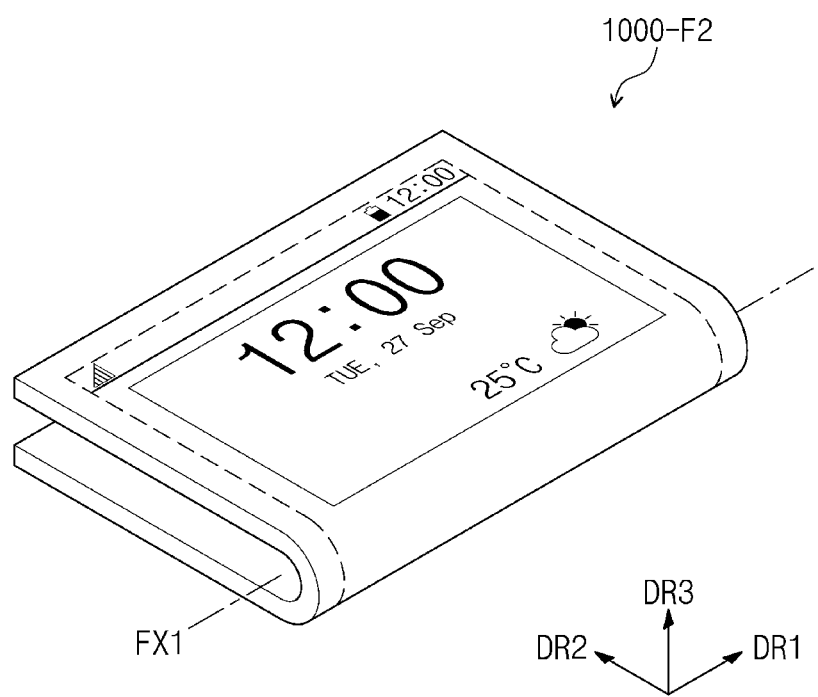

Alternatively, as illustrated in FIG. 11B, an electronic apparatus 1000-F2 may be out-folded with respect to the first folding axis FX1. When the electronic apparatus 1000-F2 is folded, the active region AA is exposed to the outside and the rear surface RS is not exposed to the outside.

Figure 11C:
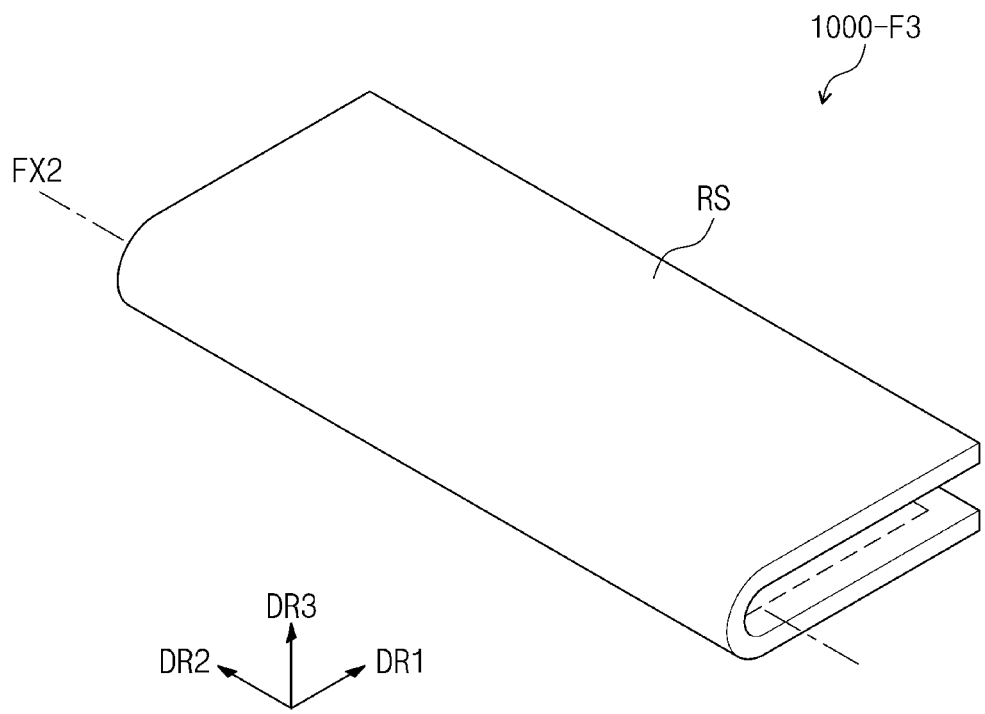

Alternatively, as illustrated in FIG. 11C, an electronic apparatus 1000-F3 may be in-folded with respect to a second folding axis FX2 extending in the second direction DR2. The second direction DR2 may correspond to the length direction of the electronic apparatus 1000-F3. When the electronic apparatus 1000-F3 is folded, the active region AA may not be viewed from the outside, and the rear surface RS of the electronic apparatus 1000-F3 may be viewed from the outside.

Figure 11D:
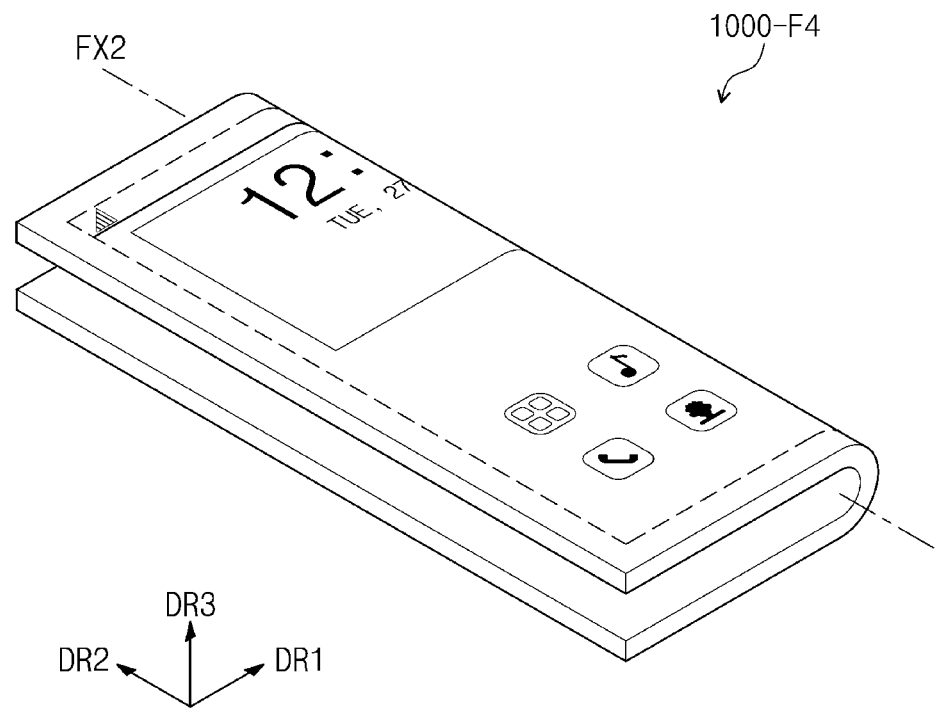

Alternatively, as illustrated in FIG. 11D, an electronic apparatus 1000-F4 may be out-folded with respect to the second folding axis FX2. When the electronic apparatus 1000-F4 is folded, the active region AA is exposed to the outside and the rear surface RS is not exposed to the outside. The electronic apparatus according to an embodiment of the inventive concept may be folded in various ways and is not limited to any one embodiment.

Figure 12:
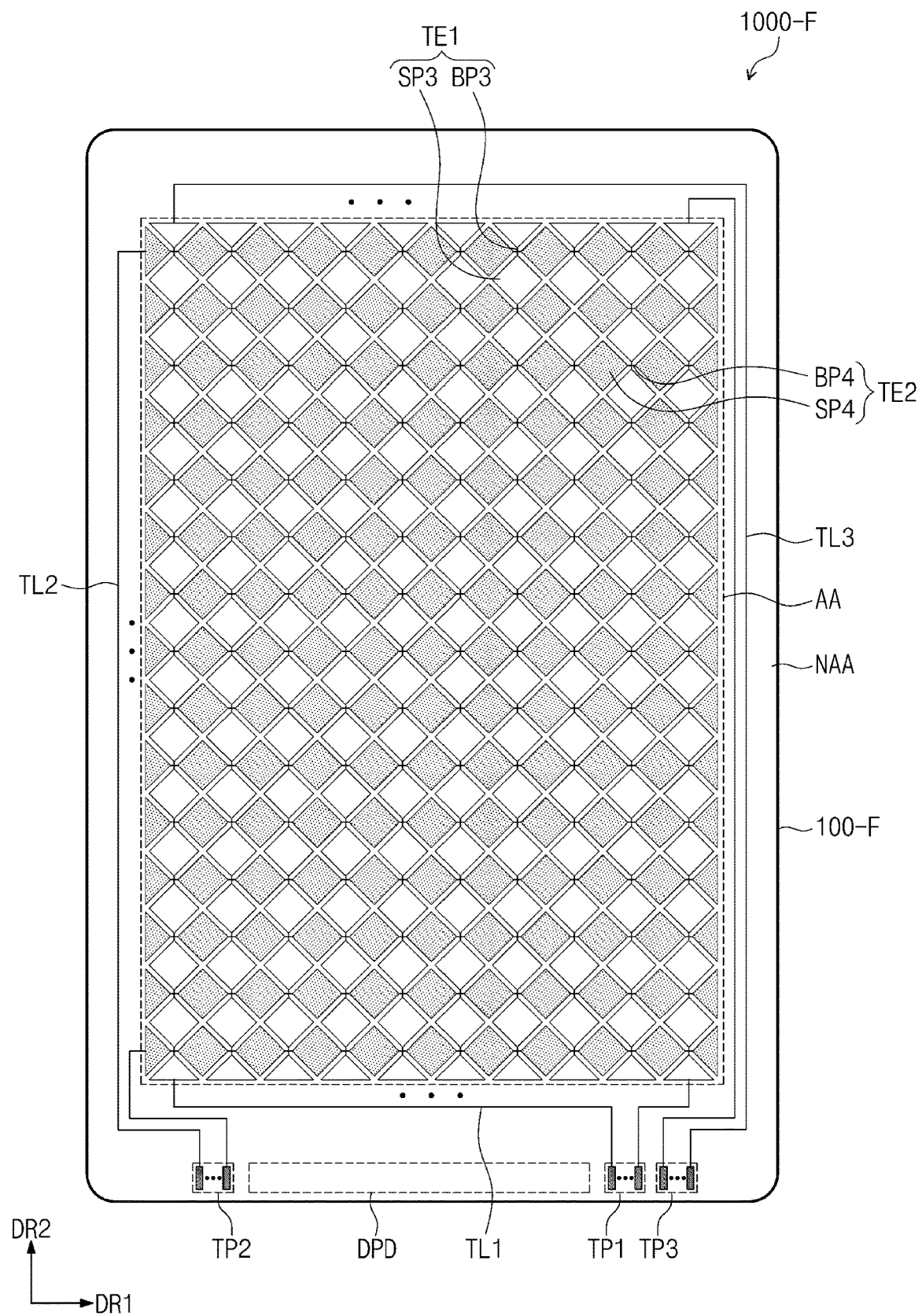
FIG. 12 is a plan view of the electronic apparatus illustrated in FIG. 10.

FIG. 12 is a plan view of the electronic apparatus illustrated in FIG. 10. Hereinafter, the inventive concept will be described with reference to FIG. 12. Meanwhile, the same reference numerals will be given to the same elements as those described with reference to FIGS. 1 to 11D, and duplicated descriptions will be omitted.

As illustrated in FIG. 12, the electronic apparatus 1000-F may have an active region AA having a tetragonal shape. A peripheral region NAA is illustrated as having a tetragonal frame shape surrounding the active region AA. The electronic apparatus 1000-F may include a plurality of sensor electrodes TE1 and TE2 arranged in the active region AA, and a plurality of signal lines TL1, TL2, and TL3 and a plurality of pads TP1, TP2, and TP3 which are disposed in the peripheral region NAA. The sensor electrodes TE1 and TE2, the signal lines TL1, TL2, and TL3, and the pads TP1, TP2, and TP3 may correspond to the sensing layer 200 (refer to FIG. 3A).

The sensor electrodes TE1 and TE2 may include a plurality of first sensor electrodes TE1 and a plurality of second sensor electrodes TE2. The first sensor electrodes TE1 are arranged along the first direction DR1 and each thereof extends along the second direction DR2. Each of the first sensor electrodes TE1 includes a plurality of first sensor patterns SP3 arranged along the second direction DR2 and first connection patterns BP3 disposed between the first sensor patterns SP3 to connect adjacent first sensor patterns SP3 to each other. The first sensor electrodes TE1 may correspond to the first sensor electrodes TX illustrated in FIG. 3A.

The second sensor electrodes TE2 are arranged along the second direction DR2 and each thereof extends along the first direction DR1. Each of the second sensor electrodes TE2 includes a plurality of second sensor patterns SP4 arranged along the first direction DR1 and second connection patterns BP4 disposed between the second sensor patterns SP4 to connect adjacent second sensor patterns SP4 to each other. The second sensor electrodes TE2 may correspond to the second sensor electrodes RX illustrated in FIG. 3A.

Accordingly, the first connection patterns BP3 and the second connection patterns BP4 may respectively correspond to the first connection patterns BP1 (refer to FIG. 3A) and the second connection patterns BP2 (refer to FIG. 3A). Since the sensor electrodes TE1 and TE2 include bar-shaped connection portions extending in the first direction DR1 or in the second direction DR2, it is possible to minimize the overlapping area in the intersecting region between the first connection patterns BP3 and the second connection patterns BP4. Accordingly, noise generation may be reduced and visibility may be improved.

Meanwhile, in this embodiment, the signal lines SL may include first to third lines TL1, TL2, and TL3. Specifically, the first and third lines TL1 and TL3 may be connected to the first sensor electrodes TE1, and the second lines TL2 may be connected to the second sensor electrodes TE2. By transferring an electrical signal to the first sensor electrodes TE1 having a relatively long length through the two lines TL1 and TL3, it is possible to reduce a difference in response speed between the first sensor electrodes TE1 and the second sensor electrodes TE2, thus allowing uniform touch sensitivity to be provided in the entire active region AA. However, this is illustrated as an example, and the electronic apparatus 1000-F may have a sensing layer having various structures and is not limited to any one embodiment.

According to the inventive concept, in an electronic apparatus, the bridge region may not be easily recognized by the user. In addition, since parasitic capacitance may be reduced, it is possible to provide an electronic apparatus capable of reducing noise generation and providing improved touch sensitivity.

Although the above has been described with reference to preferred embodiments of the inventive concept, those skilled in the art or those of ordinary skill in the art will understand that various modifications and changes can be made to the inventive concept within the scope that does not depart from the spirit and technical field of the inventive concept described in the claims to be described later. Accordingly, the technical scope of the inventive concept should not be limited to the content described in the detailed description of the specification, but should be determined by the claims as hereinafter described.

What is claimed is:

1. An electronic apparatus comprising:
  a display panel including an active region which includes a plurality of light-emitting regions;
  a first electrode comprising a plurality of first sensor patterns disposed in the active region and a plurality of first connection patterns respectively connecting adjacent first sensor patterns;
  a second electrode comprising a plurality of second sensor patterns insulated from the first electrode and disposed in the active region, and a plurality of second connection patterns respectively connecting adjacent second sensor patterns; and
  an insulating layer disposed between the plurality of first connection patterns and the plurality of second connection patterns,
  wherein each of the plurality of first connection patterns comprises:
    a first pattern and a second pattern spaced apart from each other in a first direction, respectively having a bar shape extending along a second direction crossing the first direction, and each connecting the adjacent first sensor patterns through contact holes formed in the insulating layer,
    a third pattern extending along the first direction and connected to each of the first pattern and the second pattern, and
    a fourth pattern extending along the first direction, spaced apart from the third pattern in the second direction, and connected to each of the first pattern and the second pattern,
  wherein each of the plurality of light-emitting regions comprise a light-emitting pixel, and
  wherein the light-emitting pixel includes a plurality of sub-pixels disposed between the first pattern and the second pattern along the first direction.

2. The electronic apparatus of claim 1, wherein:
  the sub-pixels are spaced apart from each other in the first direction or in the second direction.

3. The electronic apparatus of claim 2, wherein the light-emitting pixel is provided in plural between the first pattern and the second pattern, and the plurality of light-emitting pixels are arranged along the second direction.

4. The electronic apparatus of claim 1, wherein the plurality of first sensor patterns, the plurality of second sensor patterns, and the plurality of second connection patterns are disposed on a layer different from a layer on which the plurality of first connection patterns are disposed.

5. The electronic apparatus of claim 4, further comprising a floating pattern insulated from the first electrode and the second electrode, and disposed between the first pattern and the second pattern,
  wherein the floating pattern is disposed on a layer different from the layer on which the plurality of first connection patterns are disposed, and
  wherein the floating pattern does not overlap the plurality of first sensor patterns, the plurality of first connection patterns, the plurality of second sensor patterns, and the plurality of second connecting patterns in a plan view.

6. The electronic apparatus of claim 1, wherein:
  contact holes connecting the plurality of first connection patterns and the plurality of first sensor patterns through the contact holes are respectively formed to overlap the third pattern and the fourth pattern in a plan view.

7. The electronic apparatus of claim 6, wherein the contact holes overlapping the third pattern are arranged in a line along the second direction.

8. The electronic apparatus of claim 1, wherein an edge of the active region comprises at least one curved portion.

9. The electronic apparatus of claim 8, further comprising a plurality of signal lines connected to the plurality of first sensor patterns, respectively,
  wherein the signal line has a curved portion.

10. The electronic apparatus of claim 1, wherein each of the plurality of first sensor patterns comprises first mesh lines extending along the first direction and second mesh lines extending along the second direction.

11. The electronic apparatus of claim 10, wherein each of the first pattern and the second pattern is any one of the second mesh lines.

12. An electronic apparatus comprising:
  a display panel including an active region which includes a plurality of light-emitting regions;
  a first electrode comprising a plurality of first sensor patterns disposed in the active region and a plurality of first connection patterns respectively connecting adjacent first sensor patterns;
  a second electrode comprising a plurality of second sensor patterns insulated from the first electrode and disposed in the active region, and a plurality of second connection patterns respectively connecting adjacent second sensor patterns;
  an insulator disposed between the plurality of first connection patterns and the plurality of second connection patterns; and
  a floating pattern insulated from each of the first electrode and the second electrode,
  wherein:
    each of the plurality of first connection patterns comprises a first pattern and a second pattern spaced apart from each other in the first direction, each of the first pattern and the second pattern connecting the adjacent first sensor patterns through contact holes formed in the insulating layer; and
    the floating pattern is disposed between the first pattern and the second pattern on a layer different from a layer on which the plurality of first connection patterns are disposed not to overlap the first pattern and the second pattern in a plan view.

13. The electronic apparatus of claim 12, wherein each of the first pattern and the second pattern has a bar shape extending along the second direction.

14. The electronic apparatus of claim 13, wherein:
  each of the plurality of first connection patterns further comprises a third pattern and a fourth pattern spaced apart from each other in the second direction with the first pattern and the second pattern interposed therebetween and connected to the first pattern and the second pattern; and
  contact holes connecting the plurality of first connection patterns and the plurality of first sensor patterns through the contact holes are formed to overlap the third pattern and the fourth pattern in a plan view.

15. The electronic apparatus of claim 14, wherein the arrangement direction of the contact holes is a direction crossing the second direction.

16. The electronic apparatus of claim 12, wherein:
at least three sub-pixels are disposed between the first pattern and the second pattern; and
each of the plurality of light-emitting regions is a region in which each of the at least three sub-pixels emits light.

17. The electronic apparatus of claim 16, wherein the sub-pixels are spaced apart from each other in the first direction or in the second direction.

18. The electronic apparatus of claim 12, wherein:
each of the plurality of first connection patterns comprises first mesh lines extending along the first direction and second mesh lines extending along the second direction; and
each of the first pattern and the second pattern is any one of the second mesh lines.

19. The electronic apparatus of claim 12, wherein the floating pattern is disposed in the same layer as the plurality of first sensor patterns.

20. The electronic apparatus of claim 12, wherein the first pattern and the second pattern are disposed between the plurality of light-emitting regions.

* * * * *